(12) United States Patent
Kubota et al.

(10) Patent No.: US 7,855,387 B2
(45) Date of Patent: Dec. 21, 2010

(54) LIGHT-EMITTING DEVICE AND ELECTRONIC APPARATUS

(75) Inventors: Takehiko Kubota, Suwa (JP); Eiji Kanda, Suwa (JP); Ryoichi Nozawa, Tatsuno-machi (JP)

(73) Assignee: Seiko Epson Corporation, Tokyo (JP)

( * ) Notice: Subject to any disclaimer, the term of this patent is extended or adjusted under 35 U.S.C. 154(b) by 1027 days.

(21) Appl. No.: 11/548,802

(22) Filed: Oct. 12, 2006

(65) Prior Publication Data
US 2007/0120188 A1 May 31, 2007

(30) Foreign Application Priority Data
Nov. 30, 2005 (JP) ............... 2005-345299

(51) Int. Cl.
H01L 29/72 (2006.01)
(52) U.S. Cl. .................... 257/79; 257/618; 257/773; 345/76; 345/77; 345/82
(58) Field of Classification Search .................. 257/79, 257/618, 773; 345/76, 77, 82
See application file for complete search history.

(56) References Cited

U.S. PATENT DOCUMENTS

| 6,229,506 | B1 * | 5/2001 | Dawson et al. ............ 345/82 |
| 7,483,001 | B2 | 1/2009 | Matsueda |
| 2007/0080360 | A1 * | 4/2007 | Mirsky et al. ............ 257/99 |

FOREIGN PATENT DOCUMENTS

| JP | A-2003-108068 | 4/2003 |
| JP | A-2003-167533 | 6/2003 |
| JP | A-2004-133240 | 4/2004 |
| JP | A 2005-157262 | 6/2005 |
| JP | A 2005-157264 | 6/2005 |
| JP | A 2005-157266 | 6/2005 |

OTHER PUBLICATIONS

Japanese Patent Office, *Notification for Reasons for Refusal for Japanese Patent Application* 2005-345299 (with English translation), Jun. 8, 2010, pp. 1-5 (pp. 1-11 for translation).
Japanese Office Action, *Decision of Refusal for Japanese Patent Application No.* 2005-345299 (with English translation), Sep. 14, 2010, pp. 1-2 (pp. 1-6 for English translation).

* cited by examiner

*Primary Examiner*—Edward Wojciechowicz
(74) *Attorney, Agent, or Firm*—Oliff & Berridge, PLC

(57) ABSTRACT

A light-emitting device includes a drive transistor that controls a current to be supplied to a light-emitting element from a power supply line, an electrical continuity portion that electrically connects the drive transistor with the light-emitting element, an initializing transistor that is turned ON to diode-connect the drive transistor, and a connecting portion that electrically connects the drive transistor with the initializing transistor. The power supply line includes a first portion extending in a predetermined direction. The electrical continuity portion and the connecting portion are formed from the same layer as that of the power supply line and are located on one side along the width of the first portion across the drive transistor.

14 Claims, 13 Drawing Sheets

LIGHT-EMITTING DEVICE AND ELECTRONIC APPARATUS

CROSS-REFERENCE TO RELATED APPLICATION

The present application claims priority from Japanese Patent Application No. 2005-345299, filed in the Japanese Patent Office on Nov. 30, 2005, the entire disclosure of which is hereby incorporated by reference in its entirety.

BACKGROUND

1. Technical Field

The present invention relates to a structure of a light-emitting device utilizing a light-emitting material, such as an organic electroluminescent (EL) material.

2. Related Art

As one type of active matrix light-emitting device, a structure in which a transistor that controls a current to be supplied to a light-emitting element (such a transistor is hereinafter referred to as a "drive transistor") is provided for each light-emitting element is known. Another type of active matrix-light emitting device is disclosed in U.S Pat. No. 6,229,506 (FIG. 2) and JP-A-2004-133240 (FIGS. 2 and 3). In this structure, a transistor that compensates for errors of the threshold voltage of a drive transistor (such a transistor is hereinafter referred to as an "initializing transistor") is disposed between the gate electrode and the drain electrode (or source electrode) of the drive transistor. In this structure, when the initializing transistor is turned ON to allow the drive transistor to be diode-connected, the gate electrode of the drive transistor is set to be a potential corresponding to the threshold voltage. In this state, the gate electrode of the drive transistor is changed to a potential in accordance with a desired grayscale level. Then, a current which is not influenced by the threshold voltage can be supplied to the corresponding light-emitting element.

The above-described structure requires wiring patterns for electrically connecting the components related to the light emission of the light-emitting elements, for example, wiring patterns for electrically connecting the drive transistors and the initializing transistors (hereinafter such wiring patterns are referred to as "connecting portions"), and wiring patterns for electrically connecting the drive transistors and the light-emitting elements (hereinafter such wiring patterns are referred to as "electrical continuity portions"). However, if such wiring patterns are formed in different processing steps, the manufacturing process becomes complicated and the manufacturing cost is increased.

One solution to solving this problem is to form the connecting portions and the electrical continuity portions simultaneously with the formation of other components (for example, power supply lines) in the same processing step by the patterning of one conductive film. In this method, however, it is necessary to form other components, such as power supply lines, so that they can physically avoid the connecting portions and the electrical continuity portions. Because of such a restriction, for example, a sufficient width of the power supply lines cannot be ensured, and as a result, the resistance of the power supply lines cannot be sufficiently reduced.

SUMMARY

An advantage of the invention is that it provides a light-emitting device and an electronic apparatus in which connecting portions and electrical continuity portions are formed from the same layer as that of power supply lines while suppressing the resistance of the power supply lines.

According to an aspect of the invention, there is provided a light-emitting device including a drive transistor that controls a current to be supplied to a light-emitting element from a power supply line, an electrical continuity portion that electrically connects the drive transistor with the light-emitting element, an initializing transistor that is turned ON to diode-connect the drive transistor, and a connecting portion that electrically connects the drive transistor with the initializing transistor. The power supply line includes a first portion extending in a predetermined direction, and the electrical continuity portion and the connecting portion are formed from the same layer as that of the power supply line and are located on one side along the width of the first portion across the drive transistor. A specific example of this aspect is discussed below as a first embodiment.

According to this configuration, the electrical continuity portion and the connecting portion are formed from the same layer as that of the power supply line. Thus, the manufacturing process can be simplified and the manufacturing cost can be reduced compared with the configuration in which the electrical continuity portion and the connecting portion are formed from a layer different from that of the power supply line. Additionally, since the electrical continuity portion and the connecting portion are disposed on one side along the width of the first portion across the drive transistor, the space for the power supply line can be ensured on the other side along the width of the first portion across the drive transistor. Thus, a sufficient area (or line width) of the power supply line can be formed so that the resistance of the power supply line can be reduced.

Forming a plurality of components "from the same layer" is to form the plurality of components in the same step by selectively removing a common film member (it does not matter whether the common film member is a single layer or a plurality of layers), and it does not matter whether the components are connected to each other or are separated from each other.

It is preferable that the light-emitting device may further include a capacitor element electrically connected to the gate electrode of the drive transistor. In this case, the capacitor element may be disposed opposite the connecting portion and the electrical continuity portion across the drive transistor, and the first portion of the power supply line may be overlapped with the capacitor element. With this arrangement, since the power supply line can be formed such that it is overlapped with the capacitor element, a more sufficient area can be ensured for the power supply line.

It is preferable that the light-emitting device may further include a selection transistor that is turned ON or OFF according to a selection signal. In this case, the gate electrode of the drive transistor may be set to be a potential corresponding to a data signal supplied from a data line via the selection transistor that is turned ON, and the selection transistor may be disposed opposite the drive transistor across the capacitor element. With this arrangement, a sufficient area (line width) of the power supply line can be ensured, and the configuration of the power supply line can be simplified (for example, without notches) compared with the configuration in which the selection transistor is disposed in the gap between the drive transistor and the capacitor element.

It is preferable that a plurality of unit elements, each including the drive transistor, the selection transistor, and the initializing transistor, may be disposed in a direction intersecting with the predetermined direction. In this case, the selection transistor may be disposed on one side of the predetermined direction, and the initializing transistor may be disposed on the other side of the predetermined direction. With this arrangement, the selection transistor and the initializing transistor are displaced from each other in the predetermined direction, and accordingly, the gaps among the unit elements can be decreased while maintaining electrical insulation between the selection transistor and the initializing transistor.

According to another aspect of the invention, there is provided a light-emitting device including a drive transistor that controls a current to be supplied to a light-emitting element from a power supply line, an electrical continuity portion that electrically connects the drive transistor with the light-emitting element, an initializing transistor that is turned ON to diode-connect the drive transistor, and a connecting portion that electrically connects the drive transistor with the initializing transistor. The power supply line includes a first portion extending in a predetermined direction. The electrical continuity portion and the connecting portion are formed from the same layer as that of the power supply line. The electrical continuity portion is located on one side along the width of the first portion across the drive transistor, and the connecting portion is located on the other side along the width of the first portion across the drive transistor. A specific example of this aspect is discussed below as a second embodiment.

According to this configuration, the electrical continuity portion and the connecting portion are formed from the same layer as that of the power supply line. Thus, the manufacturing process can be simplified and the manufacturing cost can be reduced compared with the configuration in which the electrical continuity portion and the connecting portion are formed from a layer different from that of the power supply line. Additionally, since the electrical continuity portion and the connecting portion are respectively located on the two sides across the drive transistor, the space for the power supply line can be ensured in the gap between the electrical continuity portion and the connecting portion. Thus, a sufficient area (or line width) of the power supply line can be formed so that the resistance of the power supply line can be reduced.

It is preferable that the light-emitting device may further include a capacitor element electrically connected to a gate electrode of the drive transistor. In this case, the capacitor element may be disposed in a gap between the drive transistor and the connecting portion, and the first portion of the power supply line may be overlapped with the capacitor element. With this arrangement, since the power supply line can be formed such that it is overlapped with the capacitor element, a more sufficient area can be ensured for the power supply line.

It is also preferable that the light-emitting device may further include a selection transistor that is turned ON or OFF according to a selection signal. In this case, the gate electrode of the drive transistor may be set to be a potential corresponding to a data signal supplied from a data line via the selection transistor that is turned ON, and the selection transistor may be disposed opposite the drive transistor across the capacitor element. With this arrangement, a sufficient area (line width) of the power supply line can be ensured, and the configuration of the power supply line can be simplified (for example, without notches) compared with the configuration in which the selection transistor is disposed in the gap between the drive transistor and the capacitor element.

In the configuration in which the capacitor element is connected to the gate electrode of the drive transistor, the power supply line may be overlapped with part of or the entire capacitor element. Typically, the capacitor element is used for setting or holding the potential of the gate electrode of the drive transistor. For example, the capacitor may be interposed between the gate electrode of the drive transistor and the data line. With this configuration, due to the capacitive coupling in the capacitor element, the gate electrode is set to be the potential corresponding to a change in the potential of the data line. Alternatively, the capacitor element may be interposed between the gate electrode of the drive transistor and the wiring pattern to which a constant potential is supplied. With this configuration, the potential supplied to the gate electrode of the drive transistor from the data line can be held in the capacitor element.

It is preferable that a plurality of unit elements, each unit element including the drive transistor, the electrical continuity portion, the initializing transistor, and the connecting portion, may be disposed in a direction intersecting with the predetermined direction. In this case, the power supply line may include a plurality of the first portions corresponding to the unit elements and second portions that interconnect the first portions located adjacent to each other. With this arrangement, the resistance of the power supply line can further be reduced compared with the configuration in which the power supply line includes only the first portion.

The above-described light-emitting devices can be used for various types of electronic apparatuses. A typical example of electronic apparatuses is an apparatus utilizing the light-emitting device as a display unit. This type of electronic apparatus includes a personal computer or a cellular telephone. The purpose of the light-emitting device is not restricted to the display of images. The light-emitting device can be used for various other purposes, for example, the light-emitting device can be used for an exposure device (exposure head) for forming latent images on an image carrier, such as a photosensitive drum, by the irradiation of light, a device disposed on the back side of a liquid crystal device to illuminate the liquid crystal device (backlight), or an illumination device that is mounted on an image reader, such as a scanner, to illuminate original documents.

BRIEF DESCRIPTION OF THE DRAWINGS

The invention will be described with reference to the accompanying drawings, wherein like numbers reference like elements.

DESCRIPTION OF EXEMPLARY EMBODIMENTS

Preferred embodiments of the invention are described below with reference to the accompanying drawings.

Electrical Configuration of Light-Emitting Device

Figure 1:
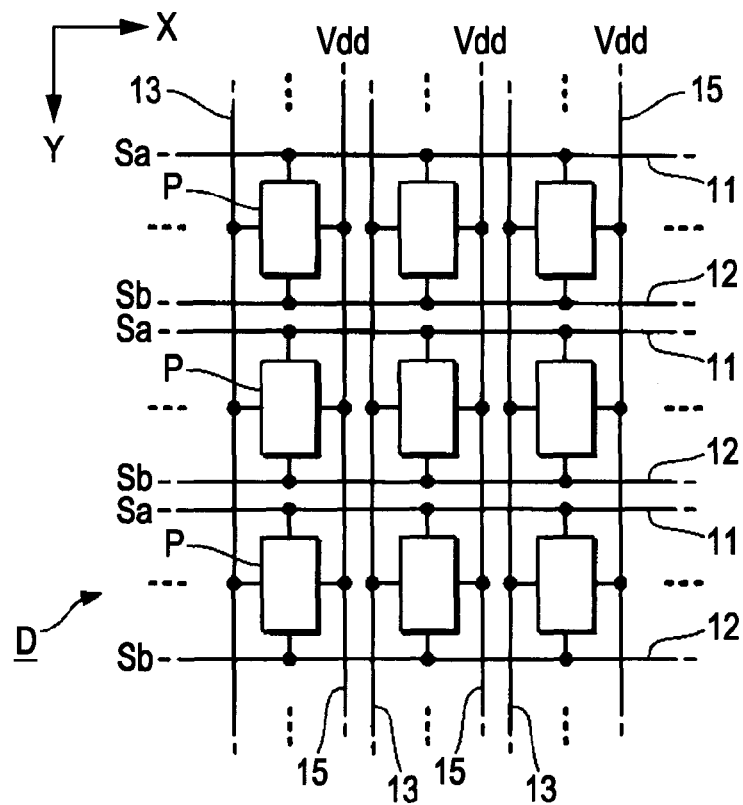
FIG. 1 is a block diagram illustrating a plurality of unit elements disposed in a light-emitting device.

FIG. 1 is a block diagram illustrating the electrical configuration of a light-emitting device D according to preferred embodiments of the invention. The light-emitting device D includes, as shown in FIG. 1, a plurality of selection lines 11, a plurality of initializing lines 12, and a plurality of data lines 13. The selection lines 11 and the initializing lines 12 are extended in the x direction. The data lines 13 are extended in the Y direction orthogonal to the x direction. A unit element (pixel) P is disposed at the intersection of each pair of the selection lines 11 and initializing lines 12 and each data line 13. Accordingly, the unit elements P are disposed in a matrix in the x direction and in the Y direction. One unit element P is the minimum unit of light emission. A high power supply potential Vdd is supplied to the unit elements P via power supply lines 15.

Figure 2:
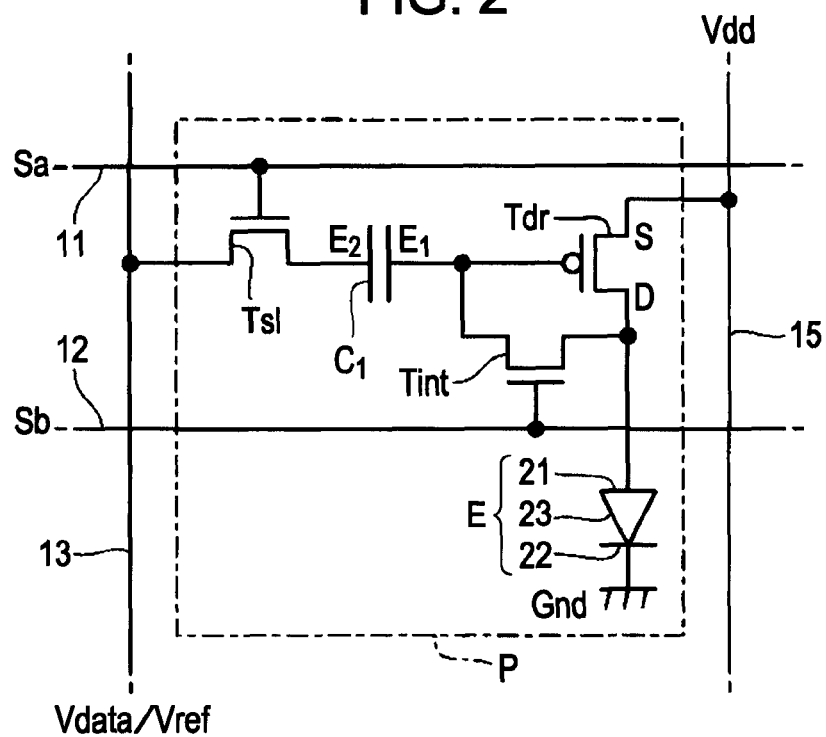
FIG. 2 is a circuit diagram illustrating the electrical configuration of each unit element.

FIG. 2 is a circuit diagram illustrating the configuration of each unit element P. A light-emitting element E and a drive transistor Tdr are disposed, as shown in FIG. 2, on the path from the power supply line 15 to a ground line (ground potential Gnd). The light-emitting element E is an element in which a light-emitting layer 23 composed of an organic EL material is disposed between a first electrode (positive electrode) 21 and a second electrode (negative electrode) 22. The first electrodes 21 are formed such that the first electrode 21 of one unit element P is separated from the first electrode 21 of the adjacent unit element P. The second electrodes 22 of the plurality of unit elements P are formed continuously and are grounded. The light-emitting layer 23 emits light with a light quantity in accordance with the current flowing from the first electrode 21 to the second electrode 22.

The drive transistor Tdr is a p-channel thin-film transistor that serves to control the current to be supplied to the light-emitting element E in accordance with the potential Vg of the gate electrode (hereinafter simply referred to as the "gate potential"). The source electrode (S) of the drive transistor Tdr is connected to the power supply line 15, while the drain electrode (D) thereof is connected to the first electrode 21 of the light-emitting element E.

An n-channel transistor (hereinafter referred to as the "initializing transistor") Tint that controls electrical connection between the gate electrode and the drain electrode (first electrode 21 of the light-emitting element E) of the drive transistor Tdr is disposed between the gate electrode and the drain electrode of the drive transistor Tdr. The gate electrode of the initializing transistor Tint is connected to the initializing line 12. An initializing signal Sb is supplied to the initializing line 12 from a drive circuit (not shown). When the initializing signal Sb reaches an active level to allow the initializing transistor Tint to be turned ON, the gate electrode and the drain electrode of the drive transistor Tdr are electrically connected (diode-connected) to each other.

The unit element P includes, as shown in FIG. 2, a capacitor element C1 formed of an electrode E1 and an electrode E2. The electrode E1 is connected to the gate electrode of the drive transistor Tdr. An n-channel transistor (hereinafter referred to as the "selection transistor") Ts1 for controlling electrical connection between the electrode E2 and the data line 13 is disposed therebetween. The gate electrode of the selection transistor Ts1 is connected to the selection line 11. A selection signal Sa is supplied to the selection line 11 from a drive circuit (not shown). The conductivity types of the drive transistor Tdr, the selection transistor Ts1, and the initializing transistor Tint can be changed from those shown in FIG. 2 if necessary.

The operation of one unit element P is described below by individually considering the operation in each of the initializing period, the writing period, and the driving period. In the initializing period, a predetermined potential Vref is supplied to the data line 13 from a drive circuit (not shown), and also, the selection signal Sa of the selection line 11 and the initializing signal Sb of the initializing line 12 are maintained at the active level (high level). Accordingly, the potential Vref is supplied to the electrode E2 of the capacitor element C1 from the data line 13 via the selection transistor Ts1. Then, the initializing transistor Tint is turned ON to allow the drive transistor Tdr to be diode-connected. Accordingly, the gate potential Vg of the drive transistor Tdr converges into the difference (Vg=Vdd−Vth) between the power supply potential Vdd supplied to the power supply line 15 and the threshold voltage Vth of the drive transistor Tdr.

Then, in the writing period after the lapse of the initializing period, the initializing signal Sb is shifted to the non-active level (low level). Accordingly, the initializing transistor Tint is turned OFF to allow the diode-connection of the drive transistor Tdr to be canceled. The potential Vref supplied to the electrode E2 from the data line 13 is changed to the potential Vdata while the selection transistor Ts1 remains ON. The potential Vdata is a potential corresponding to the grayscale level specified by the unit element P.

The impedance of the gate electrode of the drive transistor Tdr is sufficiently high. Accordingly, if the potential of the electrode E2 is changed from the potential Vref to the data potential Vdata by ΔV (=Vref−Vdata), the potential of the electrode E1 is also changed from the potential Vg(=Vdd−Vth) set in the initializing period due to capacitive coupling in the capacitor element C1. In this case, a change in the potential of the electrode E1 is determined by the ratio of the capacitance of the capacitor element C1 to other parasitic capacitances, for example, the gate capacitance of the drive transistor Tdr and parasitic capacitances of other wiring patterns. More specifically, when the capacitance of the capacitor element C1 is represented by C and when the parasitic capacitances are indicated by Cs, a change in the potential of the electrode E1 can be indicated by ΔV·C/(C+Cs). Accordingly, the gate potential Vg of the drive transistor Tdr is changed to the level expressed by equation (1) at the end of the writing period:

$$Vg = Vdd - Vth - k \cdot \Delta V \quad (1)$$

where k=C/(C+Cs).

In the driving period after the lapse of the writing period, the selection signal Sa is shifted to the non-active level to allow the selection transistor Ts1 to be turned OFF. Then, the current corresponding to the gate potential Vg of the drive transistor Tdr is supplied to the light-emitting element E from the power supply line 15 through the source electrode and the drain electrode of the drive transistor Tdr. The light-emitting element E then emits light with the light quantity corresponding to the data potential Vdata.

The current I supplied to the light-emitting element E in the driving period can be expressed by equation (2), assuming that the drive transistor Tdr is operated in a saturation region:

$$I = (\beta/2)(Vgs - Vth)2 \quad (2)$$
$$= (\beta/2)(Vdd - Vg - Vth)2$$

where β designates the gain coefficient of the drive transistor Tdr, and Vgs indicates the gate-source voltage of the drive transistor Tdr.

Equation (2) can be modified as follows by substituting equation (1) into equation (2).

$$I = (\beta/2)(k \cdot \Delta V)2$$

That is, the current I supplied to the light-emitting element E is not influenced by the threshold voltage Vth of the drive transistor Tdr. It is thus possible to suppress errors of the light quantities (non-uniformities of the luminance) of the light-emitting elements E caused by variations of the threshold voltages Vth of the drive transistors Tdr. Such variations are originated from the deviations of the threshold voltage Vth from the design value or the difference in the drive transistors Tdr of the unit elements P.

Specific Structure of Unit Element P

The specific structure of the above-described unit elements P is described below with reference to the accompanying drawings. For the sake of convenience of description, the dimensions and ratios of the components shown in the drawings are changed from those of the actual devices if necessary.

First Embodiment

Figure 3:
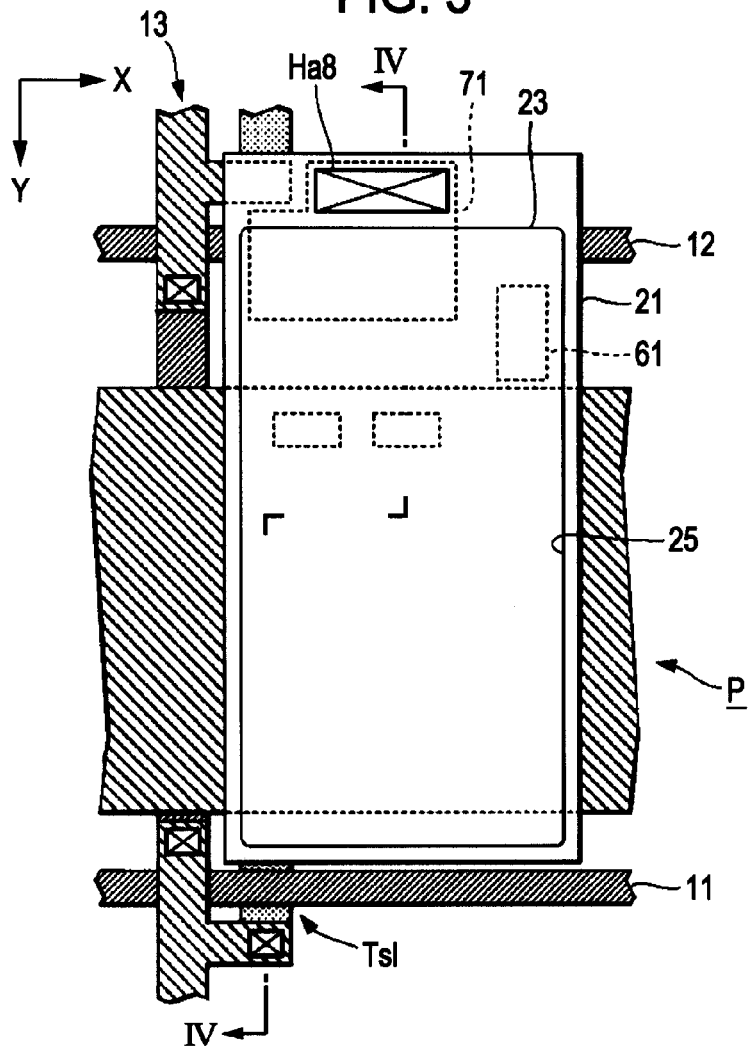
FIG. 3 is a plan view illustrating a unit element according to a first embodiment of the invention.
Figure 4:
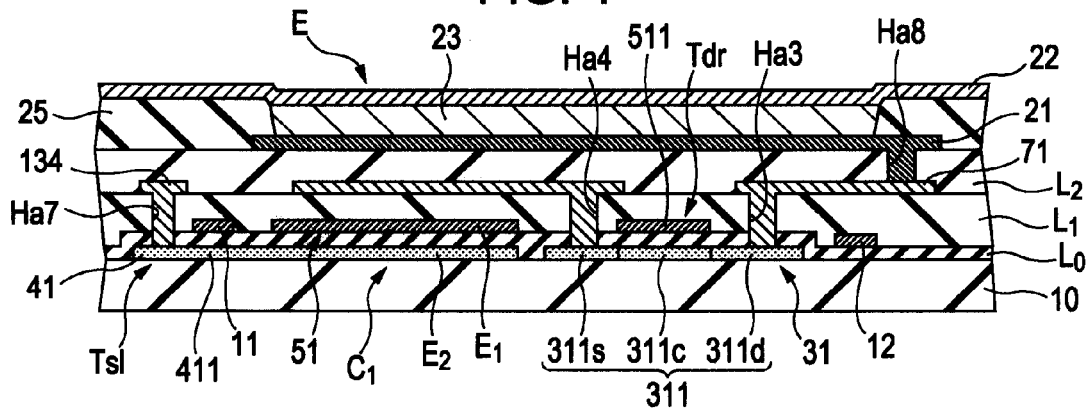
FIG. 4 is a sectional view taken long line IV-IV of FIG. 3.

A description is given below of the specific structure of the unit elements P of the light-emitting device D according to a first embodiment of the invention. FIG. 3 is a plan view illustrating one unit element P, and FIG. 4 is a sectional view taken along line IV-IV of FIG. 3. Although FIG. 3 is a plan view, for easy understanding, the components shown in FIG. 3 corresponding to the counterparts in FIG. 4 are hatched in a manner similar to the counterparts in FIG. 4. The same applies to the other plan views.

The components, such as the drive transistor Tdr and the light-emitting element E, of the unit element P shown in FIG. 2 are formed, as shown in FIG. 4, on the surface of a substrate 10. The substrate 10 is a planar member composed of an insulating material, such as glass or plastic. When forming the components of the unit element P on the surface of the substrate 10, an insulating film, such as a silicon oxide or silicon nitride film, covering the substrate 10 may be used as an underlayer of the components. Since the light-emitting device D of the first embodiment is a top emission type, it is not always necessary that the substrate 10 exhibit a light transmittance characteristic.

Figure 6:
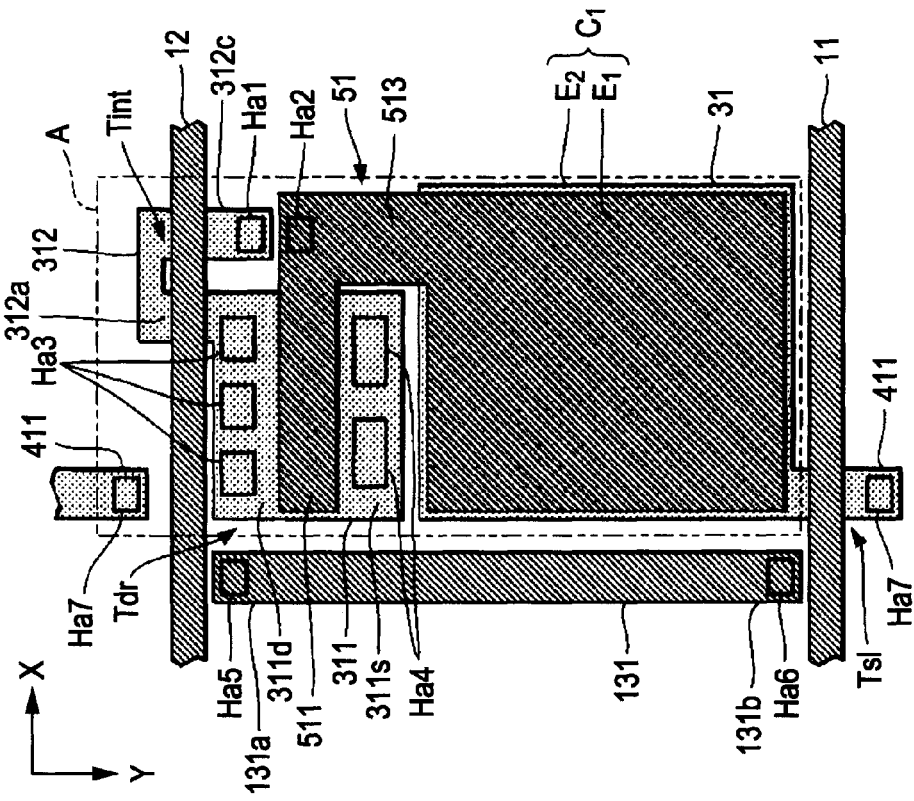
FIG. 6 is a plan view illustrating a processing step in which a first insulating layer is formed.
Figure 5:
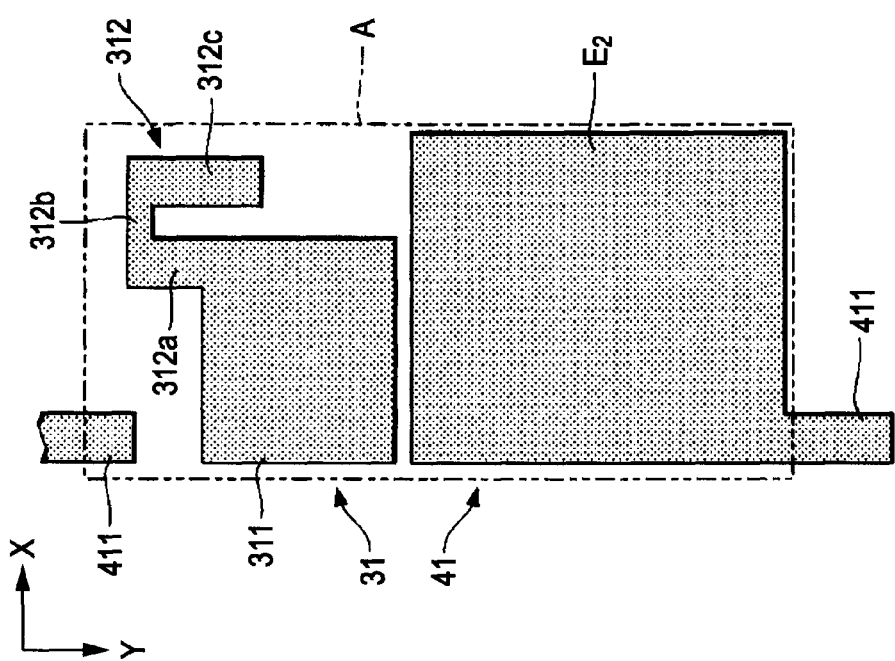
FIG. 5 is a plan view illustrating a processing step in which a gate insulating layer is formed.
Figure 7:
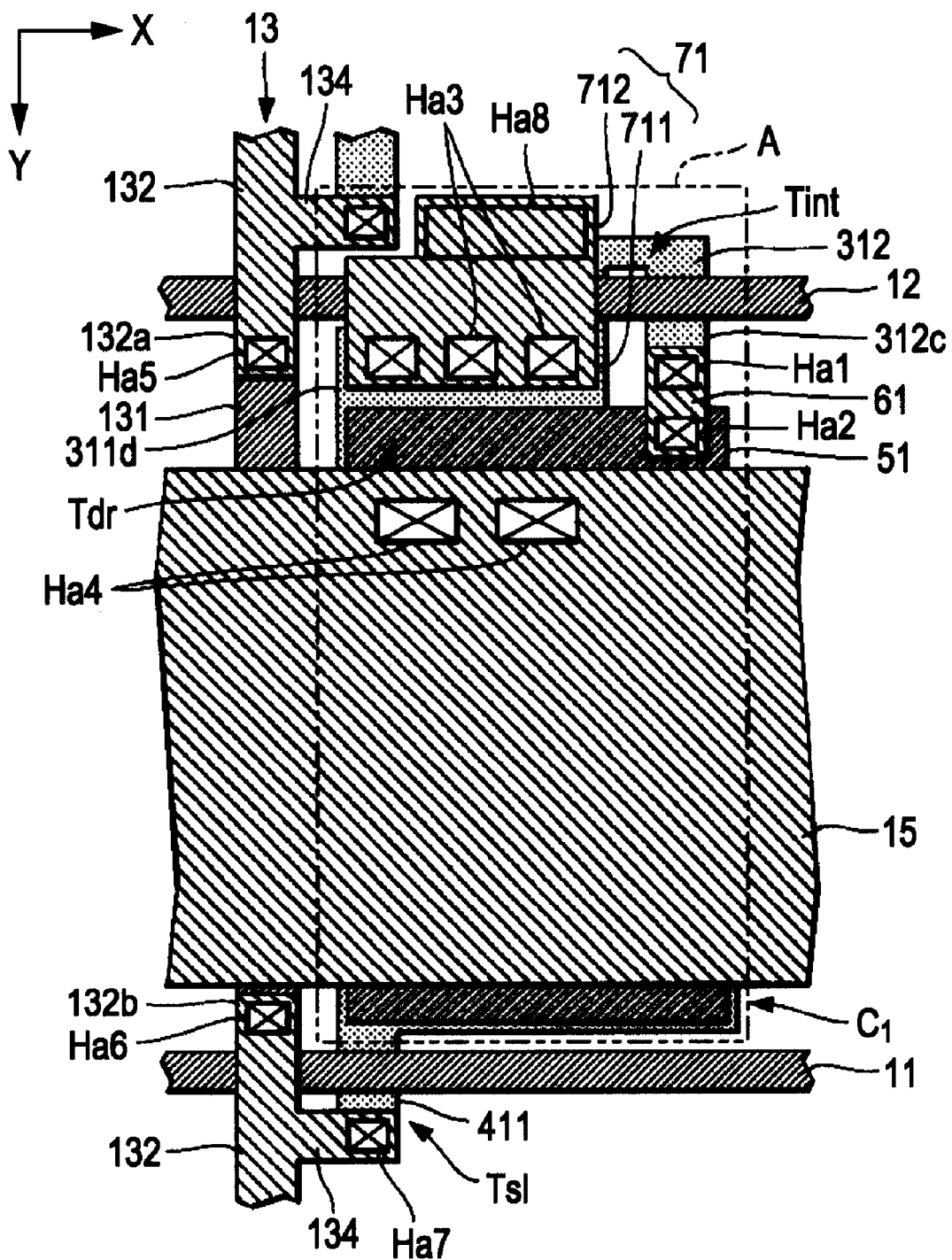
FIG. 7 is a plan view illustrating a processing step in which a second insulating layer is formed.

FIGS. 5 through 7 are plan views illustrating the surface of the substrate 10 when the unit element P is formed on the substrate 10 in various processing steps. In FIGS. 5 through 7, a region A in which the first electrode 21 shown in FIG. 3 is to be formed is indicated by the two-dot-chain lines.

A semiconductor layer 31 and a semiconductor layer 41 are formed, as shown in FIGS. 4 and 5, on the surface of the substrate 10 by a semiconductor material, such as silicon. The semiconductor layer 31 and the semiconductor layer 41 are simultaneously formed in the same step by the patterning of a film member that is continuously formed on the entire area of the substrate 10. As in the relationship between the semiconductor layer 31 and the semiconductor layer 41, forming a plurality of components in the same step by selectively removing a common film member (it does not matter whether the common film member is a single layer or a plurality of layers) is referred to as "forming components from the same layer". The components formed from the same layer are composed of the same material, and have substantially the same thickness. With this configuration, the manufacturing process can be simplified and the manufacturing cost can be reduced, compared with the case where components are formed from different layers.

The semiconductor layer 31 includes, as shown in FIGS. 4 and 5, a first element portion 311 and a second element portion 312. The first element portion 311, which is formed substantially in a rectangular shape, serves as the semiconductor layer of the drive transistor Tdr. The second element portion 312 serves as the semiconductor layer of the initializing transistor Tint. The second element portion 312 is formed toward the positive side in the x direction and toward the negative side in the Y direction (i.e., at the top right of the first element portion 311) when viewed from the first element portion 311. More specifically, as shown in FIG. 5, the second element portion 312 includes a part 312a extending toward the negative side in the Y direction from the first element portion 311, a part 312b extending toward the positive side in the x direction from the part 312a, and a part 312c extending toward the positive side in the Y direction from the part 312b.

The semiconductor layer 41, which is disposed toward the positive side in the Y direction when viewed from the semiconductor layer 31, includes the electrode E2, which is formed substantially in a rectangular shape and forms the capacitor element C1 shown in FIG. 2, and an element portion 411 extending in the Y direction from the electrode E2. The element portion 411 serves as the semiconductor layer of the selection transistor Ts1, and is formed toward the negative side in the x direction and toward the positive side in the Y direction (i.e., at the bottom left of the electrode E2) when viewed from the electrode E2.

FIG. 4, the entire surface of the substrate 10 on which the semiconductor layer 31 and the semiconductor layer 41 are formed is covered with a gate insulating layer L0. On the surface of the gate insulating layer L0, as shown in FIGS. 4 and 6, the selection line 11, the initializing line 12, an intermediate conductor 51, and a first data line portion 131 are formed from the same layer.

The selection line 11 is extended in the x direction over the plurality of unit elements P and is overlapped with the element portion 411 of the semiconductor layer 41. The area of the element portion 411 that is overlapped with the selection line 11 across the gate insulating layer L0 serves as the channel region of the selection transistor Ts1. The initializing line 12 is extended in the x direction over the plurality of unit elements P and is overlapped with the second element portion 312 of the semiconductor layer 31. The area of the part 312a or the area of the part 312c that is overlapped with the initializing line 12 across the gate insulating layer L0 serves as the channel region of the initializing transistor Tint. Accordingly, the initializing transistor Tint in this embodiment is a dual-gate-structured transistor.

The intermediate conductor 51 is formed in the gap between the selection line 11 and the initializing line 12, and includes the electrode E1, a gate electrode 511, and an interconnecting portion 513. The electrode E1 is formed substantially in a rectangular shape and is overlapped with the electrode E2 of the semiconductor layer 41 when viewed perpendicularly to the substrate 10. The electrode E1 and the electrode E2 face each other across the gate insulating layer L0 (dielectric), as shown in FIGS. 4 and 6 so that they form the capacitor element C1 shown in FIG. 2.

The interconnecting portion 513 is extended toward the negative side in the Y direction from the top right of the electrode E1. The gate electrode 511 is extended toward the negative side in the x direction from the interconnecting portion 513 such that it faces the electrode E1 with a gap therebetween, and is overlapped with the first element portion 311 over the entire width (X direction) thereof. As shown in FIG. 4, the area of the first element portion 311 that faces the gate electrode 511 across the insulating layer L0 serves as a channel region 311c of the drive transistor Tdr. The area of the first element portion 311 that is located closer to the electrode E2 than the channel region 311c (i.e., the area located in the gap between the gate electrode 511 and the electrode E1, as shown in FIG. 6, when viewed perpendicularly to the substrate 10) is a source region 311s, and the area of the first element portion 311 that is located opposite the source region 311s is a drain region 311d.

The first data line portion 131 forms the data line 13 shown in FIG. 2. The first data line portion 131 is disposed toward the negative side in the x direction when viewed from the intermediate conductor 51 and is extended in the Y direction in the gap between the selection line 11 and the initializing line 12.

Figure 8:
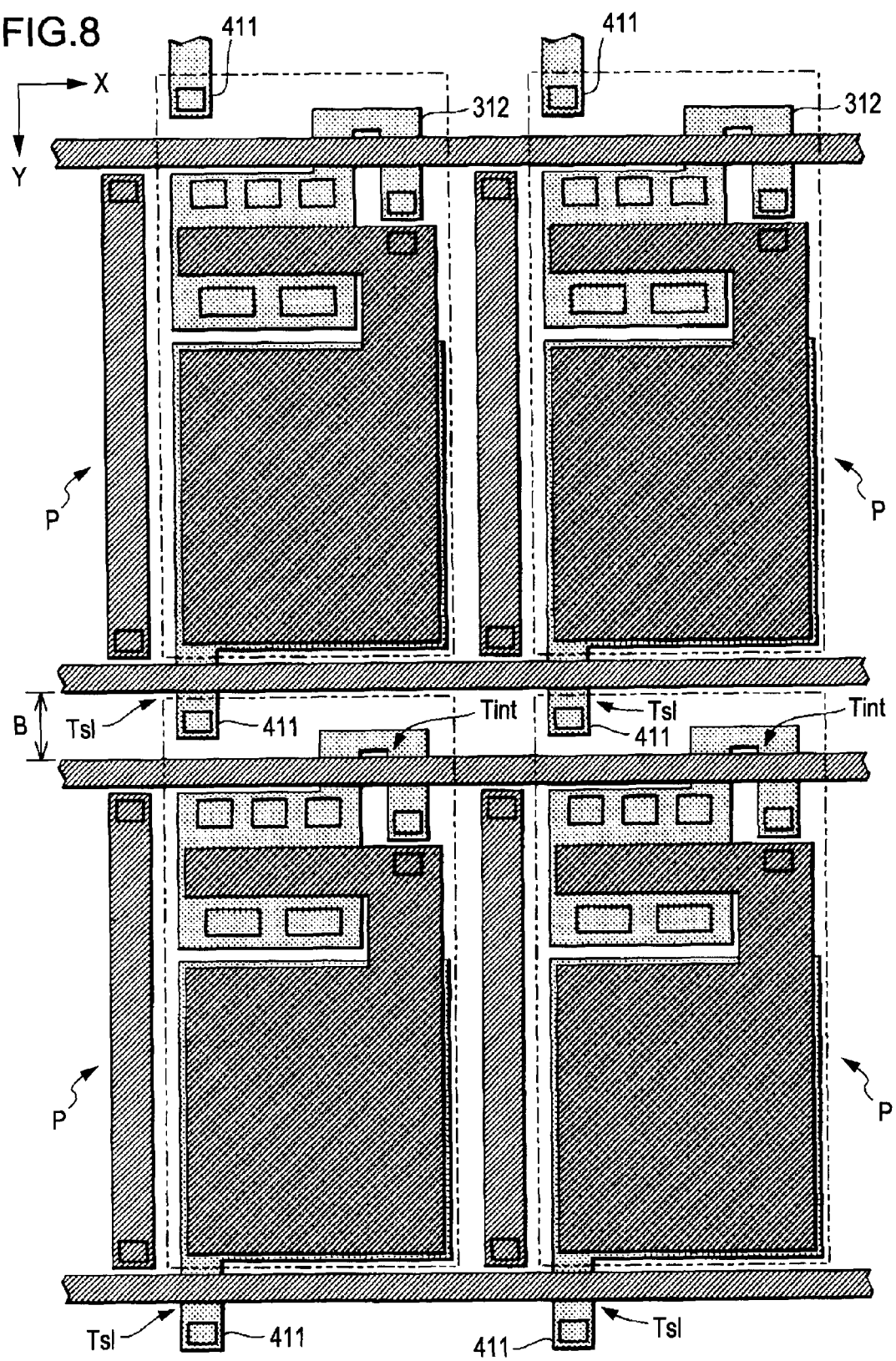
FIG. 8 is a plan view illustrating a plurality of unit elements in the processing step in which the first insulating layer is formed.

FIG. 8 is a plan view illustrating four unit elements P that are in the processing step shown in FIG. 6 and are disposed in the x direction and in the Y direction. In each unit element P, as shown in FIGS. 6 and 8, the second element portion 312 (initializing transistor Tint) formed at the periphery of the negative side in the Y direction is located toward the positive side in the x direction, while the element portion 411 (selection transistor Ts1) formed at the periphery of the negative side in the Y direction is located toward the negative side in the x direction.

It is now assumed that the second element portion 312 and the element portion 411 are disposed toward the same side in the x direction in each unit element P. With this configuration, it is necessary to ensure a sufficient gap (indicated by region B in FIG. 8) between unit elements P adjacent to each other in the Y direction so that the second element portion 312 and the element portion 411 can be separated from each other. With this configuration, the high definition of the unit elements P is impaired. According to this embodiment, however, the second element portion 312 and the element portion 411 are displaced from each other in the x direction, and thus, the second element portion 312 and the element portion 411 are alternately disposed in the x direction in the region B. With this configuration, even if the width of the region B is decreased, the second element portion 312 and the element portion 411 can be separated from each other, and the high definition of the unit elements P can be implemented.

The entire surface of the gate insulating layer L0 on which the intermediate conductor 51 and the first data line portion 131 are formed is, as shown in FIG. 4, covered with a first insulating layer L1. On the surface of the first insulating layer L1, as shown in FIGS. 4 and 7, a connecting portion 61, an electrical continuity portion 71, the power supply line 15, and a second data line portion 132 are formed from the same layer composed of a conductive material.

When viewed perpendicularly to the substrate 10, as shown in FIG. 7, the connecting portion 61 is overlapped with the end of the part 312c of the second element portion 312 located at the positive side in the Y direction and also overlapped with the intermediate conductor 51 (gate electrode 511). The connecting portion 61 is electrically connected to the part 312c through a contact hole Ha1 passing through the first insulating layer L1 and the gate insulating layer L0, and is also electrically connected to the intermediate conductor 51 through a contact hole Ha2 passing the first insulating layer L1. That is, the gate electrode 511 (electrode E1 of the capacitor element C1) of the drive transistor Tdr and the initializing transistor Tint are electrically connected to each other through the connecting portion 61. In this specification, contact holes are used for electrically connecting the components disposed on one side of an insulating layer with the components disposed on the other side of the insulating layer, and more specifically, the contact holes are, for example, holes passing through the insulating layer along the thickness thereof. The planar configuration of the contact holes can be determined as desired.

The electrical continuity portion 71 is disposed between the drive transistor Tdr and the light-emitting element E to electrically connect them. When viewed perpendicularly to the substrate 10, the electrical continuity portion 71 is located opposite the capacitor element C1 across the drive transistor Tdr (i.e., in the region toward the negative side in the Y direction with respect to the drive transistor Tdr). In this embodiment, the electrical continuity portion 71 is configured such that, when viewed perpendicularly to the substrate 10, a part 711 that is overlapped with the drain region 311d of the first element portion 311 is continuously formed with a part 712 located opposite the part 711 across the initializing portion 12.

In the area of the first insulating layer L1 that is overlapped with the drain region 311d, when viewed perpendicularly to the substrate 10, a plurality of contact holes Ha3 passing through the first insulating layer L1 and the gate insulating layer L0 are formed. The contact holes Ha3 are disposed in the x direction in which the gate electrode 511 is extended (i.e., in the direction along the channel width of the drive transistor Tdr). The part 711 of the electrical continuity portion 71 is electrically connected to the drain region 311d of the drive transistor Tdr through the contact holes Ha3.

Figure 9:
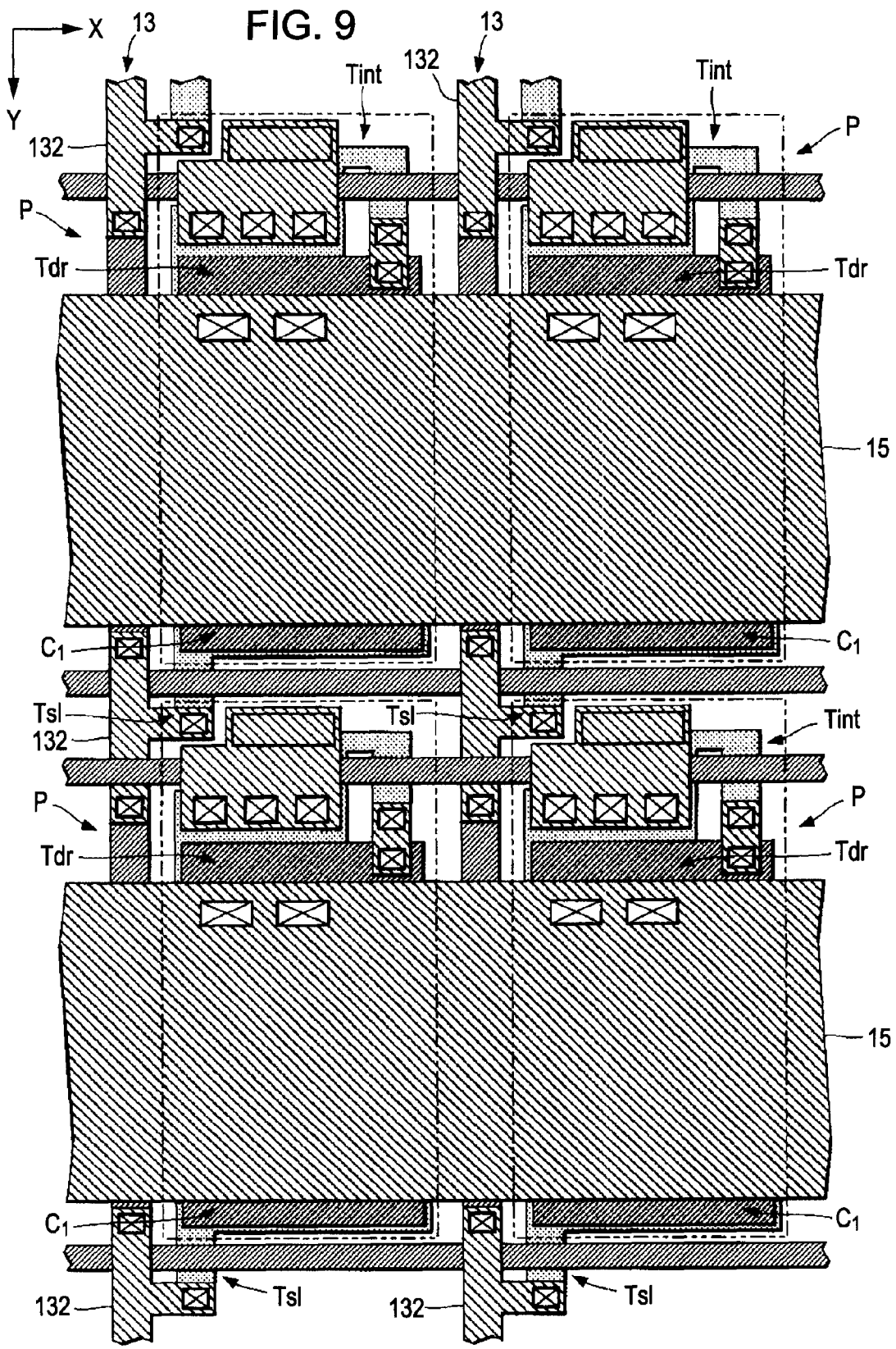
FIG. 9 is a plan view illustrating a plurality of unit elements in the processing step in which the second insulating layer is formed.

FIG. 9 is a plan view illustrating the four unit elements P that are in the processing step shown in FIG. 8 and are disposed in the x direction and in the Y direction. The power supply lines 15 are bar-like wiring patterns, as shown in FIGS. 7 and 9, which extend in the x direction in which the plurality of unit elements P are disposed. The power supply line 15 is overlapped with the capacitor element C1 of each unit element P and the source region 311s of the drive transistor Tdr, when viewed perpendicularly to the substrate 10. In the area of the first insulating layer L1 that is overlapped with the source region 311s, a plurality of contact holes Ha4 passing through the first insulating layer L1 and the gate insulating layer L0 are formed, as shown in FIG. 7. The contact holes Ha4 are located in the x direction in which the gate electrode 511 is extended. The power supply line 15 is electrically connected to the source region 311s of the drive transistor Tdr through the contact holes Ha4.

In this embodiment, the configuration and dimensions of the power supply lines 15 are determined so that the power supply lines 15 are not overlapped with the selection transistors Ts1 (element portions 411), the selection lines 11, the initializing transistors Tint (second element portion 312), and the initializing lines 12, when viewed perpendicularly to the substrate 10. In other words, the power supply lines 15 are extended in the x direction, as shown in FIG. 9, in the gap between the selection transistors Ts1 disposed along the selection lines 11 and the initializing transistors Tint disposed along the initializing lines 12.

The second data line portion 132 forms, together with the first data line portion 131, the data line 13, and is extended in the Y direction in the gap between adjacent power supply lines 15, as shown in FIGS. 7 and 9. An end 132a of the second data line portion 132 located at the positive (lower) side in the Y direction is overlapped with, as shown in FIG. 7, an end 131a (see FIG. 6) of the first data line portion 131 located at the negative (upper) side in the Y direction. The end 132a and the end 131a are electrically connected to each other through the contact hole Ha5 passing through the first insulating layer L1. Similarly, an end 132b of the second data line portion 132 located at the negative side in the Y direction is overlapped with, as shown in FIG. 7, an end 131b (see FIG. 6) of the first data line portion 131 located at the positive side in the Y direction through a contact hole Ha6. In this manner, the first data line portions 131 and the second data line portions 132 which are alternately disposed in the Y direction are electrically connected to each other so that the data lines 13 linearly extending in the Y direction can be formed.

A branched portion 134 is continuously provided, as shown in FIG. 7, from the second data line portion 132. The branched portion 134 is located opposite the capacitor element C1 across the selection line 11, and is extended in the x direction to be overlapped with the element portion 411 of the semiconductor layer 41. The branched portion 134 is electrically connected to the element portion 411 through a contact hole Ha7 passing through the first insulating layer L1 and the gate insulating layer L0. That is, the selection transistor Ts1 and the data line 13 are electrically connected to each other through the branched portion 134.

Figure 10:
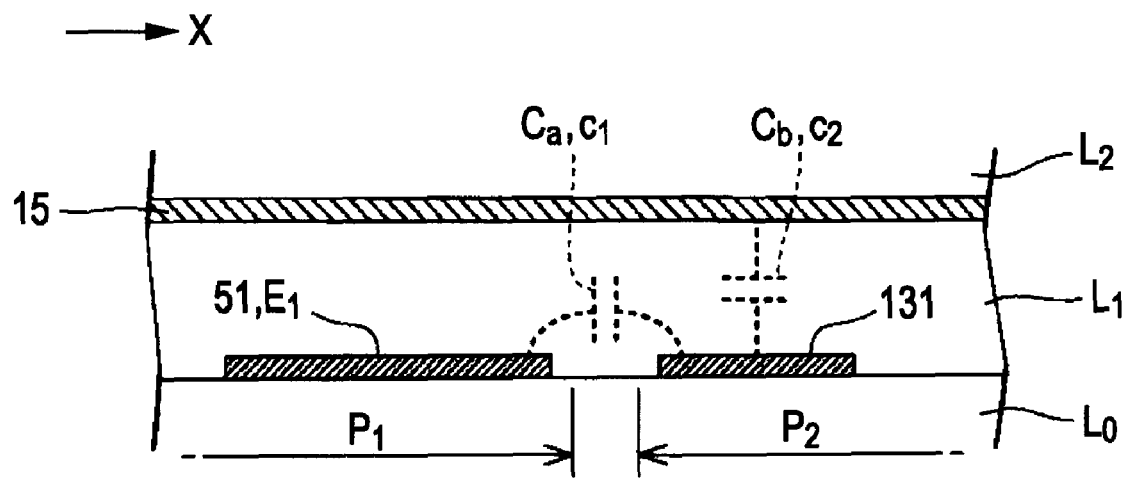
FIG. 10 is a sectional view illustrating advantages of the first embodiment.

The capacitor element C1 of each unit element P is, as shown in FIGS. 7 and 9, located adjacent to the data line 13 of the right-adjacent unit element P located at the positive side in the x direction. FIG. 10 is an enlarged, sectional view illustrating one unit element P1 and the right-adjacent unit element P2 located at the positive side in the x direction. In FIG. 10, the intermediate conductor 51 (in particular, the electrode E1 of the capacitor element C1) of the unit element P1 and the first data line portion 131 of the data line 13 corresponding to the unit element P2 are shown.

The intermediate conductor 51 and the first data line portion 131 are formed from the same layer and are thus located adjacent to each other. Accordingly, a capacitor (parasitic capacitor) Ca is formed due to capacitive coupling between the intermediate conductor 51 and the first data line portion 131. Thus, although the potential Vg of the electrode E1 (and the gate electrode 511 of the drive transistor Tdr) of the unit element P1 is set intrinsically only by a change in the potential of the data line 13 corresponding to the unit element P1 (i.e., the voltage corresponding to the grayscale level of the unit element P1), it is also influenced by a change in the potential of the first data line portion 131 corresponding to the unit element P2 (i.e., the voltage corresponding to the grayscale level of the unit element P2). That is, it is difficult to precisely set the gate potential Vg of the drive transistor Tdr of each unit element P, and errors may occur in the light quantities of the light-emitting elements E.

The first data line portion 131 and the power supply line 15 face each other across the first insulating layer L1, as shown in FIG. 10, so that a capacitance is formed therebetween. In this embodiment, as shown in FIG. 10, the capacitance c2 of the capacitor Cb formed between the first data line portion 131 of the unit element P2 and the power supply line 15 is larger than the capacitance c1 of the capacitor Ca formed between the first data line portion 131 and the intermediate conductor 51 (electrode E1) of the unit element P1. With this configuration, the influence on the intermediate conductor 51 (electrode E1) of the unit element P1 caused by a change in the potential of the first data line portion 131 of the unit element P2 is alleviated by the capacitor Cb. Accordingly, the gate potential Vg of the drive transistor Tdr of each unit element P and the light quantity of the light-emitting element E corresponding to the gate potential Vg can be set to desired values with high precision.

In this embodiment, the distance (thickness of the first insulting layer L1) between the first data line portion 131 and the power supply line 15 and the space between the intermediate conductor 51 of the unit element P1 and the first data line portion 131 of the unit element P2 are determined so that the above-described condition (c2>c1) is satisfied. More specifically, the distance (thickness of the first insulating layer L1) between the first data line portion 131 of the unit element P2 and the power supply line 15 is smaller than the space between the intermediate conductor 51 of the unit element P1 and the first data line portion 131 of the unit element P2. Additionally, the area by which the first data line portion 131 of the unit element P2 faces the power supply line 15 through the first insulating layer L1 (i.e., the area of the first data line portion 131 that is overlapped with the power supply line 15 when viewed perpendicularly to the substrate 10) is larger than the area by which the first data line portion 131 faces the intermediate conductor 151 of the unit element P1 (i.e., the area by which the side surface of the intermediate conductor 51, when viewed perpendicularly to the substrate 10, faces the side surface of the first data line portion 131). By selecting the dimensions of the components and spaces between the components as described above, the capacitance c2 can be set to be larger than the capacitance c1.

To precisely set the gate potential Vg of the drive transistor Tdr in accordance with the data potential Vdata of the data line 13, it is desirable that the capacitance c2 of the capacitor Cb of the unit element P2 is smaller than the capacitance C of the capacitor element C1 of the unit element P2 (synthesized capacitance of the capacitor element C1 and parasitic capacitance Cs if the parasitic capacitor Cs is formed in the gate electrode 511). To satisfy this condition, the gap between the first data line portion 131 and the power supply line 15 is set to be larger than the gap between the electrode E1 and the electrode E2 of the capacitor element C1. More specifically, the thickness of the first insulating layer L1 intervening between the first data line portion 131 and the power supply line 15 (i.e., the thickness of the dielectric member of the capacitor Cb) is set to be larger than the thickness of the gate insulating layer L0 intervening between the electrode E1 and the electrode E2 (i.e., the thickness of the dielectric member of the capacitor element C1). Additionally, the area by which the electrode E1 and the electrode E2 face each other (i.e., the area of the capacitor element C1) is set to be larger than the area by which the first data line portion 131 and the power supply line 15 face each other. With this arrangement, the capacitance c2 of the capacitor Cb becomes smaller than the capacitance C of the capacitor element C1.

As shown in FIG. 4, the entire surface of the first insulating layer L1 on which the second data line portion 132 and the power supply line 15 are formed is covered with a second insulating layer L2. The first electrode 21 is formed, as shown in FIGS. 3 and 4, on the surface of the second insulating layer L2. The first electrode 21 is formed substantially in a rectangular shape and is overlapped with the electrical continuity portion 71, the drive transistor Tdr, and the capacitor element C1, when viewed perpendicularly to the substrate 10. In this embodiment, the first electrode 21 is formed of a light-reflective, conductive material, such as a metal, for example, aluminum or silver, or an alloy essentially consisting of such a metal. The first electrode 21 is electrically connected to the part 712 of the electrical continuity portion 71 through a contact hole Ha8 passing through the second insulating layer L2. That is, the drain region 311d of the drive transistor Tdr is electrically connected to the first electrode 21 of the light-emitting element E through the electrical continuity portion 71.

Barriers 25 that partition the boundaries of the unit elements P are formed in a lattice-like shape on the surface of the second insulating layer L2 on which the first electrodes 21 are formed. The barriers 25 have the function of electrically insulating the first electrodes 21 located adjacent to each other, i.e., the function of controlling the potentials of the individual first electrodes 21. The light-emitting layer 23 of each light-emitting element E is enclosed in the inner periphery of the barrier 25 and is formed in a recess having the first electrode 21 as the bottom surface. Various functional layers (hole injection layer, hole transport layer, electron injection layer, electron transport layer, hole block layer, and electron block layer) for promoting or making efficient the light emission of the light-emitting layer 23 may be laminated on the light-emitting layer 23.

The second electrode 22 are formed continuously over the plurality of unit elements P, and covers the light-emitting layer 23 and the barrier 25. Accordingly, the barrier 25 serves the function of electrically insulating the first electrode 21 from the second electrode 22 in the gap of each light-emitting element E. In other words, the barrier 25 defines the area in which the current flows between the first electrode 21 and the second electrode 22 (i.e., the light-emitting area). The second electrode 22 is formed of a light-transmissive, conductive material, such as indium tin oxide (ITO) or indium zinc oxide (IZO). Accordingly, light emitted from the light-emitting layer 23 toward the side opposite the substrate 10 and light emitted from the light-emitting layer 23 toward the substrate 10 and reflected on the surface of the first electrode 21 pass through the second electrode 22 and are output. That is, the light-emitting device D of this embodiment is a top emission type.

The entire surface of the second electrode 22 is covered with a sealing material (not shown). The sealing material includes a first layer that protects the second electrode 22, a second layer that flattens the difference in the level of the surface of the second electrode 22, a third layer (barrier layer) that prevents the entry of impurities (for example, water) into the second electrode 22 and the light-emitting layer 23, the first layer, the second layer, and the third layer being laminated from the second electrode 22 in that order.

As described above, in this embodiment, the electrical continuity portion 71 is located opposite the capacitor element C1 across the drive transistor Tdr. With this configuration, the effect of reducing the capacitance required for the capacitor element C1 can be achieved. This effect is described below more specifically.

Figure 11:
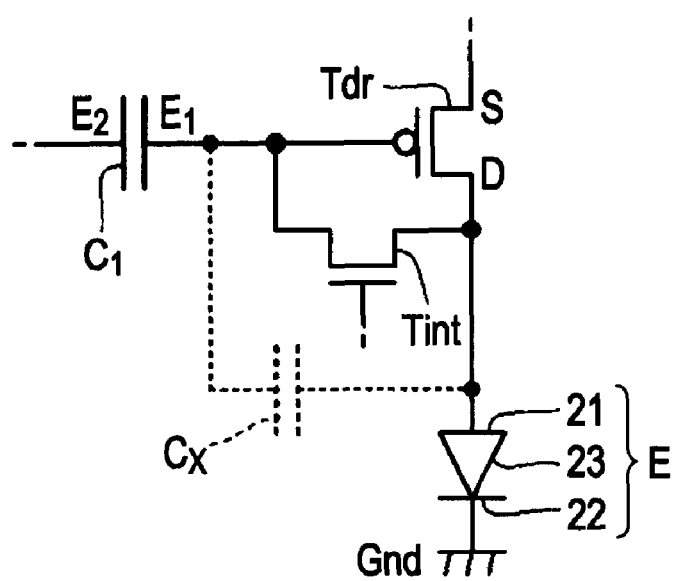
FIG. 11 is a circuit diagram illustrating advantages of the first embodiment.

It is now assumed that the electrical continuity portion 71 is disposed in the gap between the drive transistor Tdr and the capacitor element C1 when viewed perpendicularly to the substrate 10 (such a configuration is referred to as "configuration 1"). In the configuration 1, the electrode E1 of the capacitor element C1 and the electrical continuity portion 71 are located in proximity with each other across the first insulating layer L1. Accordingly, a capacitance Cx is formed between the electrode E1 and the electrical continuity portion 71 (first electrode 21), as indicated by the broken lines in FIG. 11.

During the writing period, the potential of the electrode E1 is changed by $\Delta V \cdot C/(C+Cs)$. In the configuration 1, the capacitance Cs is increased by the capacitance Cx compared with the case where the electrode E1 and the electrical continuity portion 71 are not capacitively coupled to each other. Accordingly, the fluctuations of the gate potential Vg of the drive transistor Tdr in response to the change $\Delta V$ in the potential of the data line 13 are restricted. Thus, in order to fluctuate the gate potential Vg in a wide range in response to the change $\Delta V$ in the potential of the data line 13 (i.e., to ensure a sufficient range of the light quantities of the light-emitting element E), it is necessary to ensure a sufficient capacitance C of the capacitor element C1 by reducing the thickness of the gate insulating layer L0 or increasing the areas of the electrode E1 and the electrode E2. Since there are limitations on reducing the thickness of the gate insulating layer L0, it is necessary to increase the areas of the electrode E1 and the electrode E2. On the other hand, however, an increase in the area of the capacitor element C1 impairs the high definition of the unit elements P.

If the electrode E1 and the electrical continuity portion 71 are separated from each other by forming the first insulating layer L1 to be sufficiently thick, the capacitance Cx can be reduced in the configuration 1. However, if the first insulating layer L1 is formed to be thick, defects related to film formation, such as cracks, are likely to occur, and also, the perfect electrical continuity among the components cannot be established due to the defects of contact holes (for example, contact holes cannot be perfectly formed from the first insulating layer L1). Thus, there are also limitations on reducing the capacitance Cx by this method.

In contrast, according to this embodiment, since the electrical continuity portion 71 is disposed opposite the capacitor element C1 across the drive transistor Tdr, the capacitance Cx generated between the electrode E1 and the electrical continuity portion 71 can be reduced to a sufficient level compared with the configuration 1. Accordingly, the gate potential Vg of the gate electrode 511 of the drive transistor Tdr (and the light quantity of the light-emitting element E) can be changed in a wide range without the need to considerably increase the area of the capacitor element E1 as in the configuration 1.

In this embodiment, both the electrical continuity portion 71 and the connecting portion 61 formed from the same layer as that of the power supply line 15 are located farther toward the negative side in the Y direction than the drive transistor Tdr (i.e., on one side along the width of the power supply line 15) when viewed perpendicularly to the substrate 10. With this configuration, a sufficient space can be ensured for the power supply line 15 on the surface of the first insulating layer L1 farther toward the positive side in the Y direction than drive transistor Tdr (i.e., on the other side along the width of the power supply line 15). Accordingly, the power supply line 15 can be formed to be wide so that the resistance can be sufficiently reduced. In particular, in this embodiment, since the power supply line 15 can be formed such that it is overlapped with the capacitor element C1, the resistance of the power supply line 15 can be reduced more considerably compared with the configuration in which the power supply line 15 is overlapped with only the source region 31 s of the drive transistor Tdr. The reduced resistance of the power supply line 15 suppresses a voltage drop in the power supply line 15. As a result, variations in the power supply potential Vdd supplied to the unit elements P and variations in the light quantities of the light-emitting elements E can be reduced.

In the configuration in which the electrical continuity portion 71 and the connecting portion 61 are disposed in the gap between the drive transistor Tdr and the capacitor element C1, it is necessary to form the power supply line 15 such that it can physically avoid the electrical continuity portion 71 and the connecting portion 61. However, the complexity of the configuration of the power supply line 15 encourages a break or damage in the power supply line 15 because of the manufacturing technique. Conversely, according to this embodiment, since a space can be ensured for the power supply line 15 opposite the electrical continuity portion 71 and the connecting portion 61 across the drive transistor Tdr, the power supply line 15 can be formed in a simple bar-like shape, as shown in FIG. 7. As a result, a break or damage in the power supply line 15 can be suppressed so that the yield of the light-emitting devices D can be improved.

With a view to reducing the resistance of the power supply line 15, the power supply line 15 could be overlapped with, not only the drive transistor Tdr and the capacitor element C1, but also the selection transistor Ts1 and the initializing transistor Tint. Such a configuration is hereinafter referred to as "configuration 2". In the configuration 2, however, the selection transistor Ts1 or the selection line 11 is capacitively coupled to the power supply line 15 (i.e., a parasitic capacitance is generated therebetween), which encourages the occurrence of blunt waves in the selection signal Sa. Similarly, the capacitance generated between the initializing transistor Tint or the initializing line 12 and the power supply line 15 may cause blunt waves in the initializing signal Sb. Thus, in the configuration 2, the switching of the selection transistor Ts1 or the initializing transistor Tint may be delayed.

On the other hand, according to this embodiment, when viewed perpendicularly to the substrate 10, the power supply line 15 is not overlapped with the selection transistor Ts1 or the selection line 11 or the initializing transistor Tint or the initializing line 12. Accordingly, the capacitance between the power supply line 15 and the selection transistor Ts1 or the selection line 11 or the initializing transistor Tint or the initializing line is smaller than that of the configuration 2. Thus, the occurrence of blunt waves in the selection signal Sa or the initializing signal Sb can be suppressed so that the fast operation of the selection transistor Ts1 or the initializing transistor Tint can be achieved.

Second Embodiment

Figure 13:
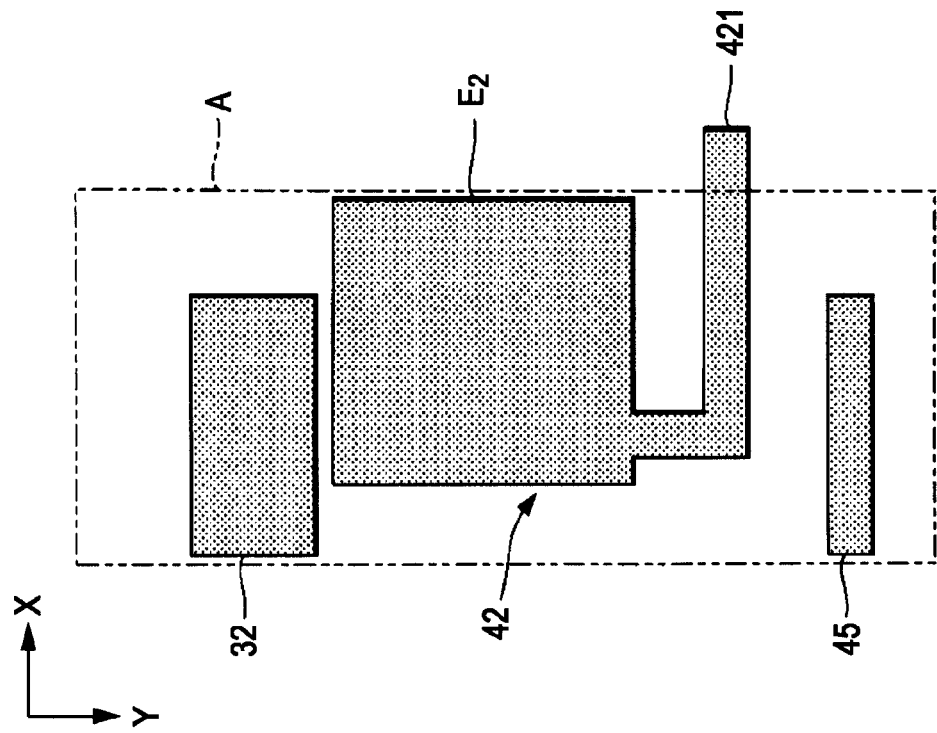
FIG. 13 is a plan view illustrating a processing step in which a gate insulating layer is formed.
Figure 12:
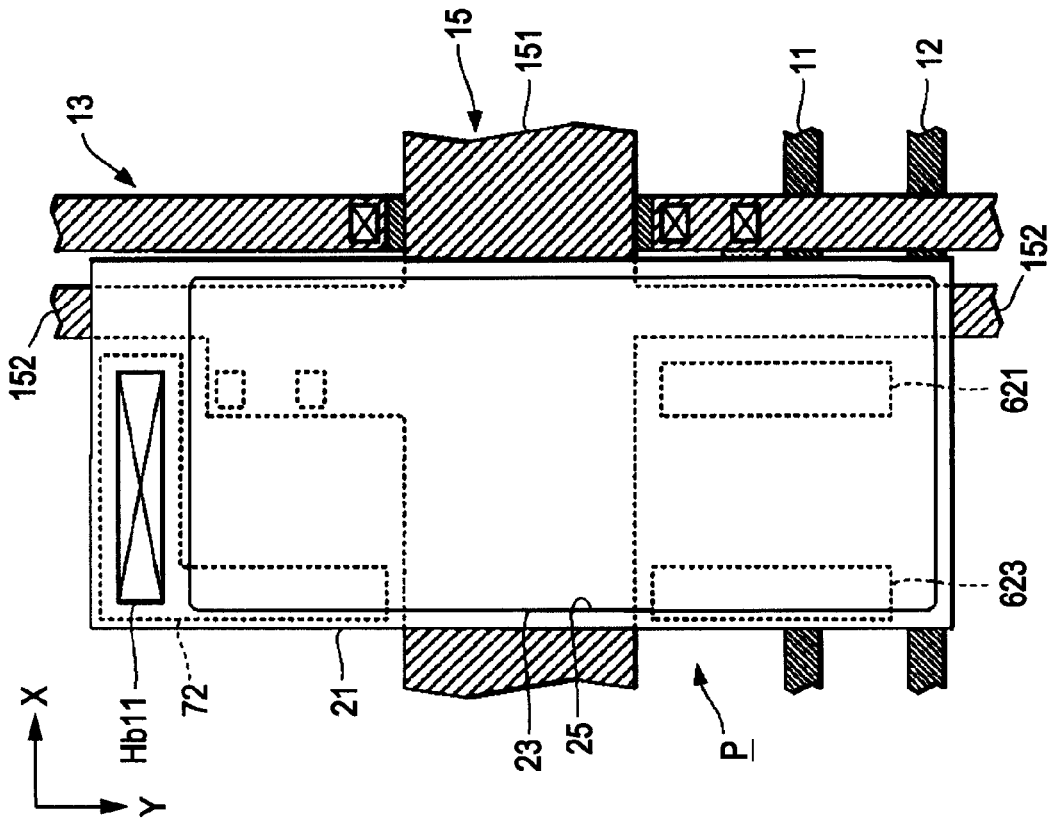
FIG. 12 is a plan view illustrating a unit element according to a second embodiment of the invention.
Figure 14:
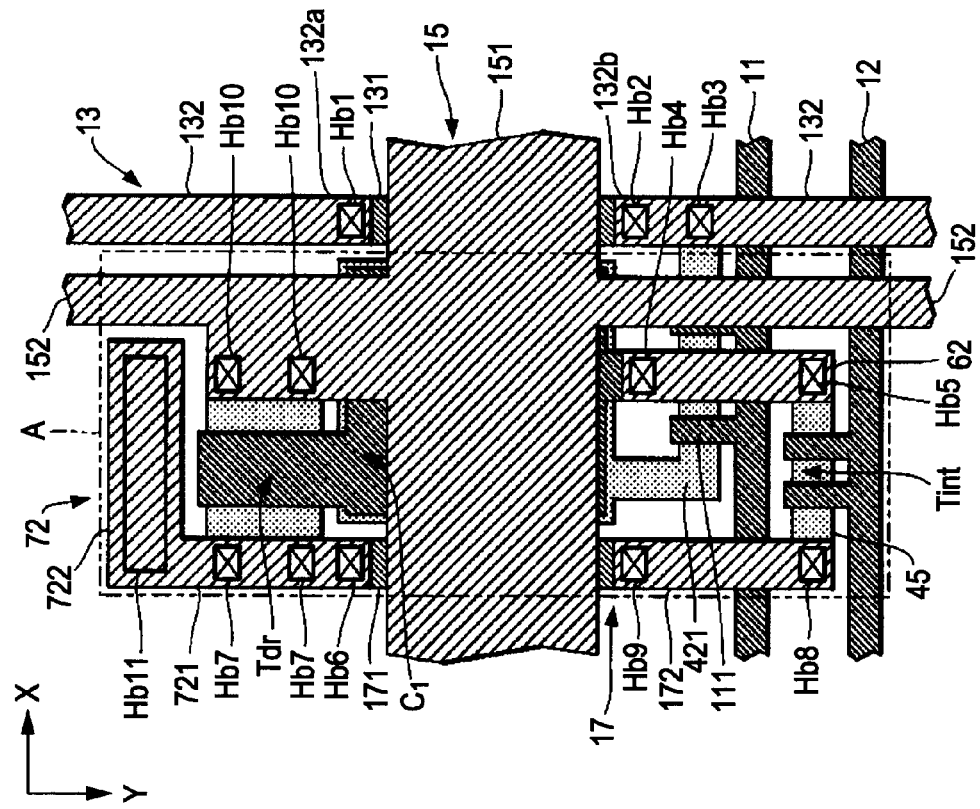
FIG. 14 is a plan view illustrating a processing step in which a first insulating layer is formed.
Figure 15:
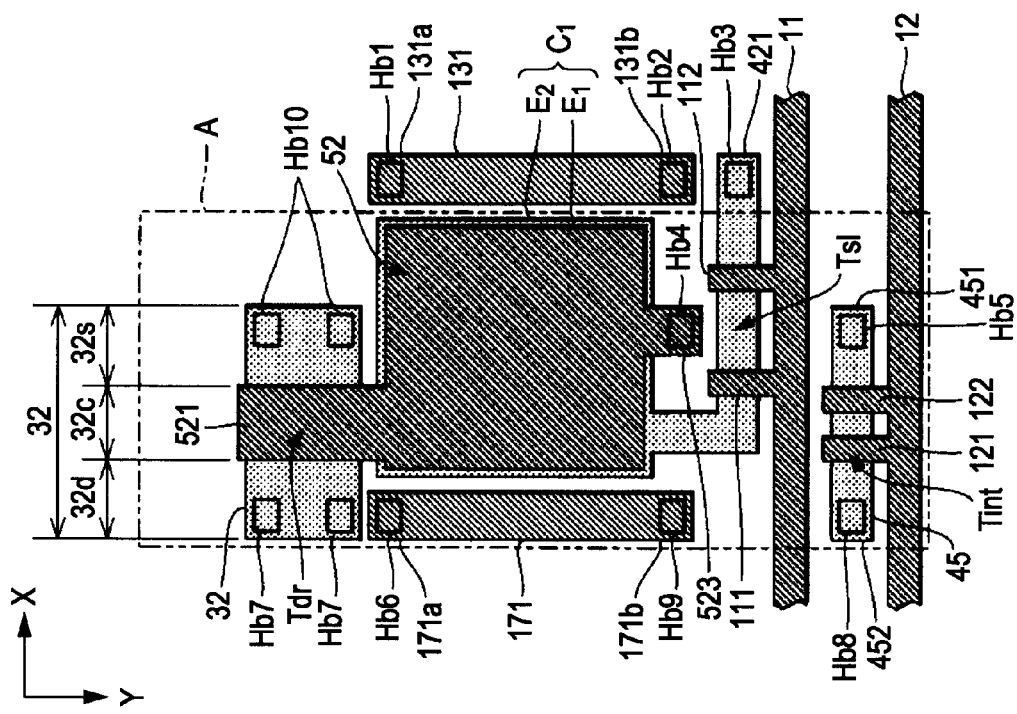
FIG. 15 is a plan view illustrating a processing step in which a second insulating layer is formed.

The specific configuration of a unit element P according to a second embodiment of the invention is described below. FIG. 12 is a plan view illustrating the configuration of the unit element P of the second embodiment. FIGS. 13 through 15 are plan views illustrating the surface of the substrate 10 when the unit element P is formed on the substrate 10 in various processing steps. In the following description, the same components as those of the first embodiment are designated with like reference numerals, and an explanation thereof is thus omitted.

On the surface of the substrate 10, as shown in FIG. 13, a semiconductor layer 32, a semiconductor layer 42, and a semiconductor layer 45 are formed from the same layer by using a semiconductor material. The semiconductor layer 32, which is formed substantially in a rectangular shape, forms the drive transistor Tdr. The semiconductor layer 42 is formed toward the positive side in the Y direction when viewed from the semiconductor layer 32, and includes a substantially rectangular electrode E2 and an element portion 421 extending in the x direction from the bottom left portion of the electrode E2. The element portion 421 functions as the semiconductor layer of the selection transistor Ts1. The semiconductor layer 45 forms the initializing transistor Tint and is extended in the x direction while facing the semiconductor layer 32 across the semiconductor layer 42.

The surface of the substrate 10 on which the above-described components are formed is covered with the gate insulating layer L0. As shown in FIG. 14, the first data line portion 131, the selection line 11, the initializing line 12, the intermediate conductor 52, and a first relay wiring pattern 171 are formed from the same layer on the surface of the gate insulating layer L0. As in the first embodiment, the first data line portion 131 forms the data line 13, and is extended in the Y direction and is located farther toward the positive side in the x direction than the intermediate conductor 52.

The initializing line 12 includes a first gate electrode 121 and a second gate electrode 122 which are branched from the midpoint portion of the initializing line 12 toward the negative side of the Y direction and which are overlapped with the semiconductor layer 45. The areas of the semiconductor layer 45 that are overlapped with the first gate electrode 121 and the second gate electrode 122 serve as the channel region of the initializing transistor Tint. Similarly, the selection line 11 includes a first gate electrode 111 and a second gate electrode 112 which are branched from the midpoint portion of the selection line 11 toward the negative side in the Y direction and which are overlapped with the element portion 421 of the semiconductor layer 42. The first gate electrode 111 and the second gate electrode 112 are located adjacent to each other in the x direction with a gap therebetween. The areas of the element portion 421 that are overlapped with the first gate electrode 111 and the second gate electrode 112 across the gate insulating layer L0 serve as the channel region of the selection transistor Ts1. Accordingly, the selection transistor Ts1 and the initializing transistor Tint are dual-gate-structured thin-film transistors.

The intermediate conductor 52 includes an electrode E1 that forms the capacitor element C1 while facing an electrode E2, a gate electrode 521 extending from the electrode E1 toward the negative side in the Y direction, and a connecting portion 523 projecting from substantially the central portion of the electrode E1 toward the positive side in the Y direction. The gate electrode 521 is extended in the Y direction such that it is overlapped with the entire width of the semiconductor layer 32 in the Y direction. As shown in FIG. 14, the area of the semiconductor layer 32 that faces the gate electrode 521 across the gate insulating layer L0 serves as a channel region 32c of the drive transistor Tdr. A drain region 32d and a source region 32s are respectively disposed toward the negative side and the positive side in the x direction across the channel region 32c.

The first relay wiring pattern 171 is a wiring pattern for electrically connecting the initializing transistor Tint with the drain region 32d of the drive transistor Tdr (such a wiring pattern is hereinafter referred to as a "relay wiring pattern"), and is extended in the Y direction and is located farther toward the negative side in the x direction than the intermediate conductor 52. That is, in this embodiment, the intermediate conductor 52 is disposed in the gap between the first data line portion 131 and the first relay wiring pattern 171.

The surface of the gate insulating layer L0 on which the above-described components are formed is covered with the first insulating layer L1. As shown in FIGS. 12 and 15, the second data line portion 132, a connecting portion 62, a second relay wiring pattern 172, an electrical continuity portion 72, and the power supply line 15 are formed on the surface of the first insulating layer L1.

As in the first embodiment, the second data line portion 132 forms, together with the first data line portion 131, the data line 13. The second data line portion 132 is extended in the Y direction from the end 132a which is electrically connected to the top end 131a (see FIG. 14) of the first data line portion 131 through a contact hole Hb1 to the end 132b. The end 132b is electrically connected to the bottom end 131b (see FIG. 14) of the first data line portion 131 through a contact hole Hb2. The second data line portion 132 is electrically connected to the end of the element portion 421 through a contact hole Hb3 passing through the first insulating layer L1 and the gate insulating layer L0. That is, the data line 13 and the selection transistor Ts1 are electrically connected to each other through the contact hole Hb3.

The connecting portion 62 is extended, as shown in FIGS. 14 and 15, in the Y direction such that it is overlapped with the connecting portion 523 of the intermediate conductor 52 and an end 451 of the semiconductor layer 45 located at the positive side in the x direction. The connecting portion 62 is electrically connected to the connecting portion 523 (electrode E1 and gate electrode 521) through a contact hole Hb4 passing through the first insulating layer L1, and is also connected to the end 451 of the semiconductor layer 45 through a contact hole Hb5 passing through the first insulating layer L1 and the gate insulating layer L0. That is, the electrode E1 of the capacitor element C1 (and the gate electrode 521 of the drive transistor Tdr) and the initializing transistor Tint are electrically connected to each other through the connecting portion 62.

When viewed perpendicularly to the substrate 10, as shown in FIG. 15, the connecting portion 62 is located in the gap between the first gate electrode 111 and the second gate electrode 112 of the selection transistor Ts1. Accordingly, the connecting portion 62 is not overlapped with the first gate electrode 111 or the second gate electrode 112. If the connecting portion 62 is overlapped with the first gate electrode 111 (or the second gate electrode 112), capacitive coupled is established therebetween. Accordingly, due to a change in the potential of the connecting portion 62 (i.e., the potential of the electrode E1 and the potential of the gate electrode 511 of the drive transistor Tdr), the potential of the first gate electrode 111 is also changed, thereby encouraging the occurrence of blunt waves in the initializing signal Sb. As a result, a delay may be caused in the operation of the initializing transistor Tint.

In this embodiment, however, since the connecting portion 62 is formed such that it is not overlapped with the first gate electrode 111 or the second gate electrode 112, the capacitive coupling therebetween can be suppressed. Accordingly, the influence on the initializing transistor Tint by a change in the potential of the connecting portion 62 is reduced, and as a result, the fast operation of the initializing transistor Tint can be achieved.

As described above, the initializing transistor Tint and the electrode E1 of the capacitor element C1 are electrically connected to each other through the connecting portion 62. With this configuration, sufficient channel lengths can be ensured for the selection transistor Ts1 and the initializing transistor Tint, and leakage of the current in the selection transistor Ts1 or the initializing transistor Tint can be suppressed compared with the configuration with restricted channel lengths. Since the selection transistor Ts1 and the initializing transistor Tint are connected to the gate electrode 521 of the drive transistor Tdr, fluctuations in the potential of the gate electrode 521 during the driving period caused by reduced leakage can be suppressed. Accordingly, in this embodiment, it is possible to maintain desired values of the light quantities of the light-emitting elements E with high precision.

As in the electrical continuity portion 71 of the first embodiment, the electrical continuity portion 72 shown in FIG. 15 is disposed between the drain electrode of the drive transistor Tdr and the first electrode 21 of the light-emitting element E so that it can electrically connect them. The electrical continuity portion 72 is configured (substantially in an L shape) such that a part 721 extending in the Y direction is continuously formed with a part 722 located opposite the capacitor element C1 across the drive transistor Tdr. The part 721 is overlapped with a top end 171a (see FIG. 14) of the first relay wiring pattern 171 and the drain region 32d of the semiconductor layer 32. The part 721 is electrically connected to the top end 171a through a contact hole Hb6 passing through the first insulating layer L1.

In the area of the first insulating layer L1 that is overlapped with the drain region 32d, a plurality of (in this case, two) contact holes Hb7 passing through the first insulating layer L1 and the gate insulating layer L0 are formed. The contact holes Hb7 are disposed in the Y direction in which the gate electrode 521 is extended (i.e., along the channel width of the drive transistor Tdr). The part 721 of the electrical continuity portion 72 is electrically connected to the drain region 32d through the contact holes Hb7.

The second relay wiring pattern 172 is extended, as shown in FIGS. 14 and 15, in the Y direction such that it is overlapped with the first relay wiring pattern 171 and an end 452 of the semiconductor layer 45 located at the negative side in the x direction. The second relay wiring pattern 172 is electrically connected to the end 452 through a contact hole Hb8 passing through the first insulating layer L1 and the gate insulating layer L0, and is also connected to a bottom end 171b of the first relay wiring pattern 171 through a contact hole Hb9 passing through the first insulating layer L1. In this manner, the initializing transistor Tint and the drain region 32d of the drive transistor Tdr (and the electrical continuity portion 72) are electrically connected to each other through a relay wiring pattern 17 formed by the first relay wiring pattern 171 and the second relay wiring pattern 172.

Figure 16:
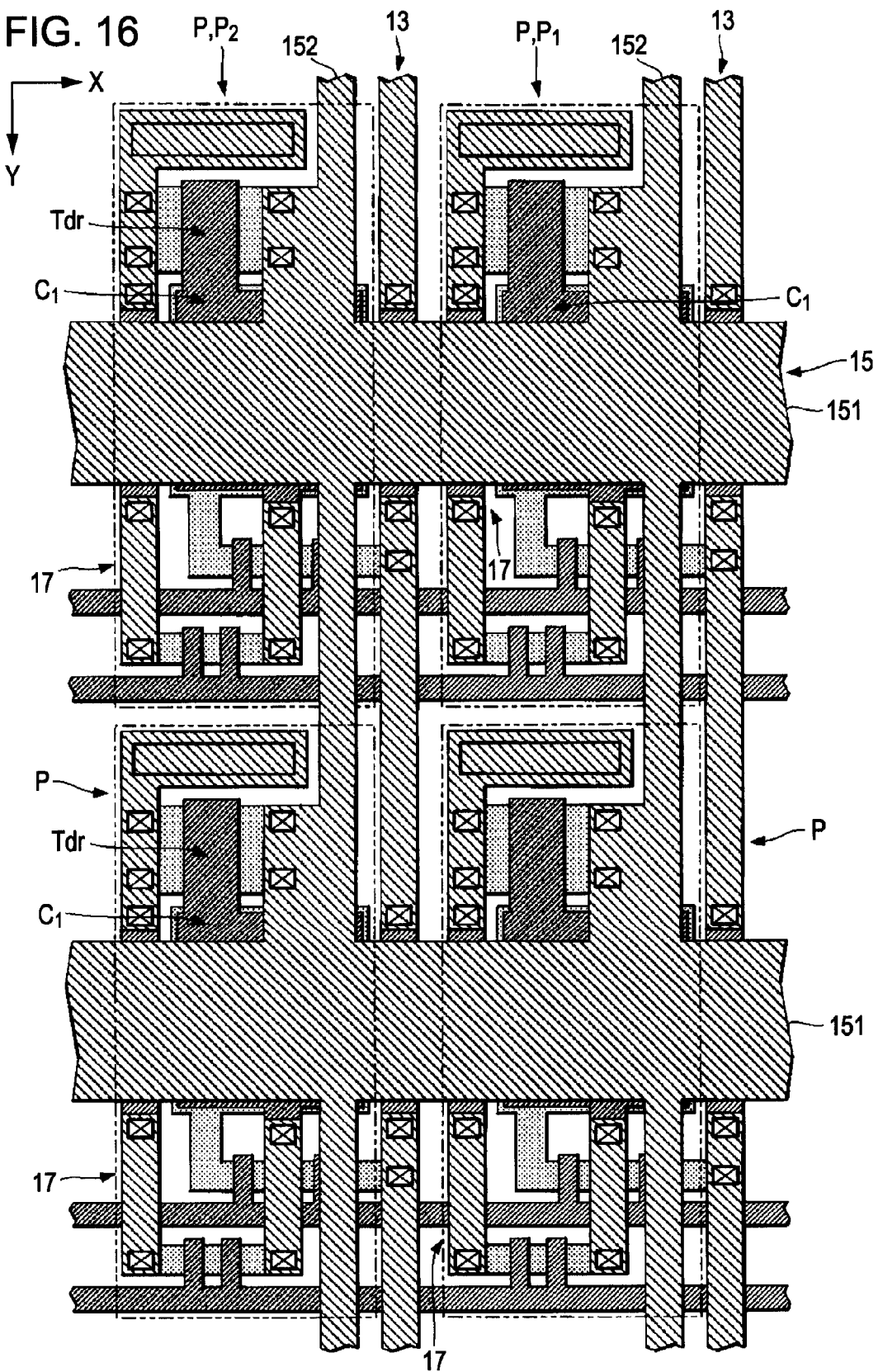
FIG. 16 is a plan view illustrating a plurality of unit elements in the processing step in which the second insulating layer is formed.

FIG. 16 is a plan view illustrating the four unit elements P that are in the processing step shown in FIG. 15 and disposed in the x direction and in the Y direction. The power supply line 15 of this embodiment is configured, as shown in FIGS. 15 and 16, such that a first portion 151 extending in the x direction over a plurality of unit elements P and a second portion 152 extending in the Y direction over a plurality of unit elements P cross each other (in a lattice-like form).

In the area of the first insulating layer L1 that is overlapped with the source region 32s of the semiconductor layer 32, as shown in FIG. 15, a plurality of (in this case, two) contact holes Hb10 passing through the first insulating layer L1 and the gate insulating layer L0 are formed. The contact holes Hb10 are disposed in the Y direction in which the gate electrode 521 is extended. The power supply line 15 (second portion 152) is electrically connected to the source region 32s through the contact holes Hb10.

The first portion 151 is extended in the x direction such that it passes through the gap between the second data line portions 132 and the gap between the second relay wiring pattern 172 and the electrical continuity portion 72 (part 721). Accordingly, when viewed perpendicularly to the substrate 10, as shown in FIGS. 15 and 16, the first portion 151 is overlapped with the first data line portion 131, the first relay wiring pattern 171, and the capacitor element C1. The second portion 152 is extended in the Y direction such that it passes through the gap between the electrical continuity portion 72 (part 722) and the second data line portion 132 and the gap between the connecting portion 62 and the second data line portion 132. As shown in FIGS. 15 and 16, the power supply line 15 is not overlapped with the selection transistor Ts1 or the initializing transistor Tint.

The entire surface of the first insulating layer L1 on which the above-described elements are formed is covered with the second insulating layer L2. The light-emitting elements E and the barriers 25 that partition the gaps between the light-emitting elements E are formed, as shown in FIG. 12, on the surface of the second insulating layer L2. As in the first embodiment, the part 722 of the electrical continuity portion 72 is electrically connected to the first electrode 21 through a contact hole Hb11 passing through the second insulating layer L2. The specific configurations of the light-emitting element E and the barrier 25 are similar to those of the first embodiment.

As discussed above, in this embodiment, the electrical continuity portion 72 is disposed opposite the capacitor element C1 across the drive transistor Tdr. Accordingly, as in the first embodiment, the parasitic capacitance (capacitance Cx shown in FIG. 11) formed between the electrode E1 and the electrical continuity portion 72 is reduced. As a result, the capacitance of the capacitor element C1 can be reduced. Additionally, since the power supply line 15 is formed such that it is not overlapped with the selection transistor Ts1 or the initializing transistor Tint. Accordingly, as in the first embodiment, it is possible to achieve a fast operation of the selection transistor Ts1 and the initializing transistor Tint with desired timings.

In this embodiment, the electrical continuity portion 72, the connecting portion 62, and the second relay wiring pattern 172 are formed from the same layer as that of the power supply line 15. Also, the electrical continuity portion 72 is disposed farther toward the negative side in the Y direction than the drive transistor Tdr (i.e., on one side along the width of the power supply line 15), and the connecting portion 62 and the second relay wiring pattern 172 are disposed opposite the electrical continuity portion 72 (i.e., on the other side along the width of the power supply line 15). Accordingly, a sufficient space can be formed for the first portion 151 of the power supply line 15 extending in the x direction in the gap between the electrical continuity portion 72 and the connecting portion 62 (second relay wiring pattern 172). Additionally, the space that is overlapped with the capacitor element C1 when viewed perpendicularly to the substrate 10 can be utilized for the power supply line 15. Thus, as in the first embodiment, the power supply line 15 (first portion 151) can be formed to be wide so that the resistance of the power supply line 15 can be reduced.

In this embodiment, since the first portions 151 can be interconnected to each other by the second portions 152 extending in the Y direction, the resistance of the power supply line 15 can further be reduced compared with the configuration in which the power supply line 15 is formed of only the first portions 151. Additionally, since the first portion 151 of the power supply line 15 is formed in a simple shape, such as a bar-like shape, a break or damage in the power supply line 15 can be suppressed compared with the configuration in which the power supply line 15 is formed in a complicated shape so that it can avoid the components (electrical continuity portion 72 and connecting portion 62) formed from the same layer as that of the power supply line 15.

In this embodiment, in each unit element P, the data line 13 is extended along the periphery toward the positive side in the x direction, and the relay wiring pattern 17 is extended along the periphery toward the negative side in the x direction. With this configuration, when focusing on one unit element P1 and a unit element P2 adjacently located toward the negative side in the x direction, as shown in FIG. 16, the relay wiring pattern 17 of the unit element P1 intervenes between the capacitor element C1 of the unit element P1 and the data line 13 corresponding to the unit element P2. Accordingly, the capacitance formed between the capacitor element C1 of the unit element P1 and the data line 13 of the unit element P2 can be reduced compared with the configuration of the first embodiment in which the capacitor element C1 of one unit element P is located in proximity with the data line 13 of the adjacent unit element P. With this configuration, the influence on the capacitor element C1 of the unit element P1 by a change in the potential of the data line 13 of the unit element P2 can be suppressed. As a result, the gate potential Vg of the drive transistor Tdr of each unit element P and the light quantity of the light-emitting element E corresponding to the gate potential Vg can be set to desired values with high precision.

Modified Examples of Second Embodiment

Figure 17:
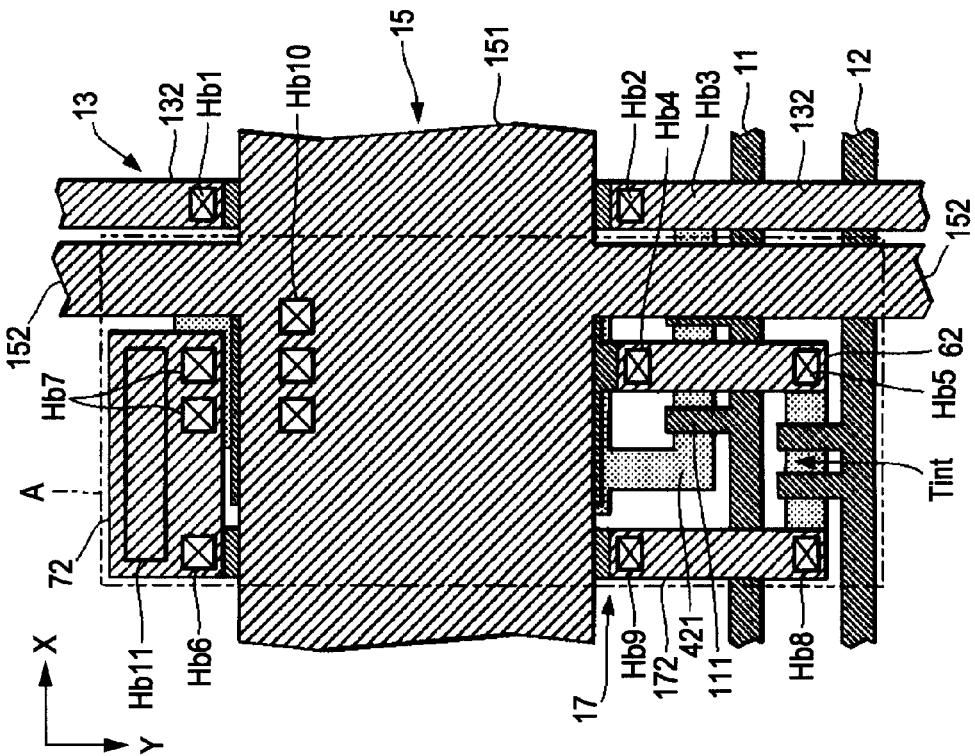
FIG. 17 is a plan view illustrating a processing step in which a first insulating layer is formed in a modified example of the second embodiment.

A modified example of the above-described second embodiment is as follows. FIG. 17 is a plan view illustrating the unit element P in the processing step shown in FIG. 14 in which the first insulating layer L1 is formed. In the second embodiment, the gate electrode 521 of the drive transistor Tdr is extended in the Y direction. In this modified example, however, as shown in FIG. 17, the gate electrode 521 of the drive transistor Tdr is extended in the x direction. In this modified example, elements similar to those of the second embodiment are designated with like reference numerals, and an explanation thereof is thus omitted.

The intermediate conductor 52 of this modified example includes an interconnecting portion 525 extending from the top left of the electrode E1 toward the negative side in the Y direction and the gate electrode 521 which extends in the x direction from interconnecting portion 525 and which is overlapped with the semiconductor layer 32. The gate electrode 521 is overlapped with the entire width of the semiconductor layer 32 in the x direction. The area of the semiconductor layer 32 that faces the gate electrode 521 across the gate insulating layer L0 serves as the channel region 32c of the semiconductor layer 32. The drain region 32d and the source region 32s are respectively disposed toward the negative side and the positive side in the Y direction across the channel region 32c.

Figure 18:
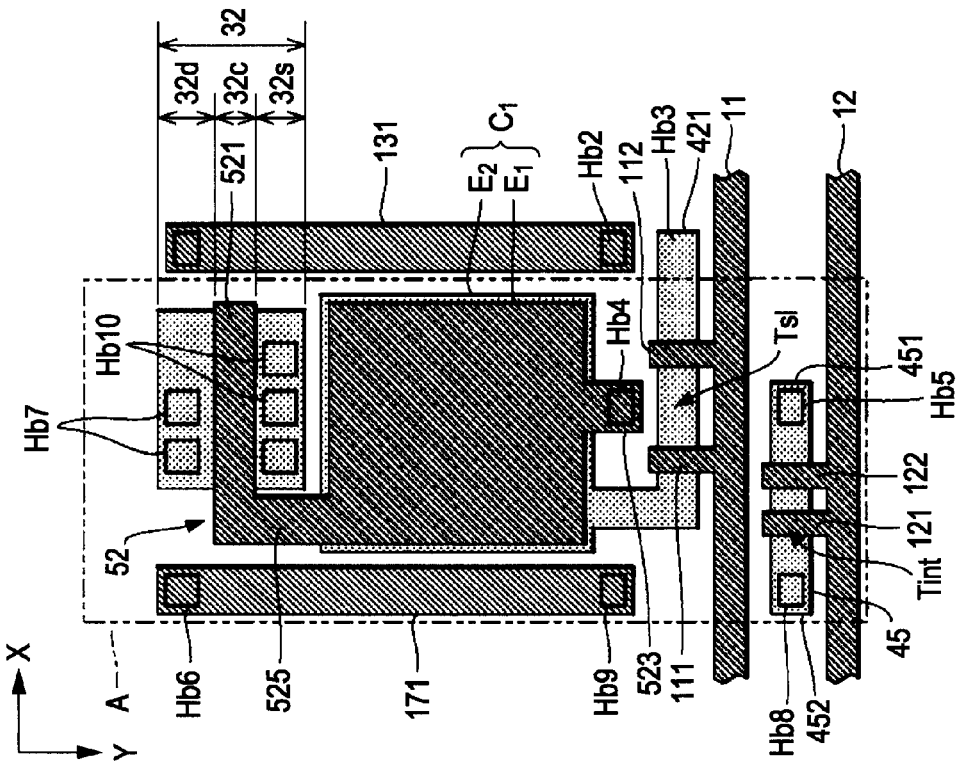
FIG. 18 is a plan view illustrating a processing step in which a second insulating layer is formed in a modified example of the second embodiment.

FIG. 18 is a plan view illustrating the unit element P in the processing step shown in FIG. 15 in which the power supply line 15 and the electrical continuity portion 72 are formed. The electrical continuity portion 72 is formed, as shown in FIG. 18, substantially in a rectangular shape in the area opposite the capacitor element C1 across the drive transistor Tdr. As shown in FIGS. 17 and 18, the electrical continuity portion 72 is electrically connected to the drain region 32d through the plurality of contact holes Hb7 disposed in the x direction in which the gate electrode 521 is extended (i.e., in the direction along the channel width of the drive transistor Tdr). The power supply line 15 is electrically connected to the source region 32s through the plurality of contact holes Hb10 disposed in the x direction in which the gate electrode 521 is extended.

As described above, since the gate electrode 521 of the drive transistor Tdr is extended in the x direction, the drain region 32d is formed in an elongated shape in the x direction in the area opposite the capacitor element C1 across the gate electrode 521. With this configuration, it is not necessary to form a portion (part 721 in the first embodiment) extending in the Y direction along the drive transistor Tdr for the electrical continuity portion 72. Thus, according to this modified example, as is seen from comparison of FIG. 18 with FIG. 15, the first portion 151 of the power supply line 15 extending along the gate electrode 521 can be formed to be wider than that of the second embodiment.

In this modified example, the contact holes Hb7, the contact hole Hb6 (the continuity portion between the relay wiring pattern 17 and the electrical continuity portion 72), and the contact hole Hb1 (the continuity portion between the first data line portion 131 and the second data line portion 132) are disposed linearly in the x direction. Accordingly, a sufficient line width of the first portion 151 extending linearly (in a bar-like shape) in the x direction can be ensured compared with the configuration in which the contact holes Hb7, Hb6 and Hb1 are displaced from each other in the x direction.

In the second embodiment, the gate electrode 521 is extended in the direction orthogonal to the first portion 151 of the power supply line 15. Accordingly, as the length of the gate electrode 521 (strictly speaking, the length of the part 721 of the electrical continuity portion 72) becomes longer, the line width of the first portion 151 becomes smaller. In contrast, in this modified example, since the gate electrode 521 is extended in parallel with the first portion 151, the length of the gate electrode 521 can be increased without reducing the line width of the first portion 151. The length of the gate electrode 521 corresponds to the channel width of the drive transistor Tdr. Accordingly, the channel width of the drive transistor Tdr can be increased while maintaining the line width of the first portion 151. It is thus possible to ensure a sufficient current to be supplied to the light-emitting element E from the power supply line 15 via the drive transistor Tdr having a large channel width.

MODIFIED EXAMPLES

Various modifications can be made to the above-described embodiments. Specific modified examples are as follows. The following modified examples may be combined if necessary.

First Modified Example

The electrical configuration of the unit elements P in the above-described embodiments may be changed if necessary. Examples of the specific mode of the unit element P that are applicable to the invention are as follows.

Figure 19:
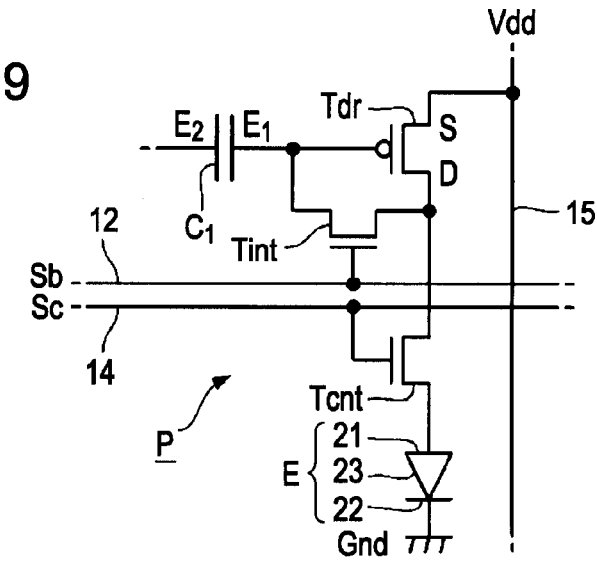
FIG. 19 is a circuit diagram illustrating the configuration of a unit element of a modified example.

A light-emission control transistor Tcnt may be inserted, as shown in FIG. 19, between the drive transistor Tdr and the light-emitting element E. The light-emission control transistor Tcnt is a switching element for controlling the electrical connection between the drain electrode of the drive transistor Tdr and the first electrode 21 of the light-emitting element E in accordance with a light-emission control signal Sc supplied to a light-emission control line 14. When the light-emission control transistor Tcnt is turned ON, a current path from the power supply line 15 to the light-emitting element E is formed to allow the light-emitting element E to emit light. When the light-emission control transistor Tcnt is turned OFF, the current path is disconnected to prohibit the light-emitting element E from emitting light. With this configuration, therefore, in the period other than the initializing period and the writing period, i.e., only in the driving period, the light-emission control transistor Tcnt is turned ON to allow the light-emitting element E to emit light. Accordingly, the period during which the light-emitting element E emits light can be precisely set.

In this modified example, the light-emission control transistor Tcnt is disposed opposite the capacitor element C1 across the drive transistor Tdr (i.e., toward the negative side in the Y direction). According to this configuration, the power supply line 15 can be formed to be wider such that it is overlapped with the drive transistor Tdr and the capacitor element C1 compared with the configuration in which the light-emission control transistor Tcnt is disposed in the gap between the drive transistor Tdr and the capacitor element C1.

Figure 20:
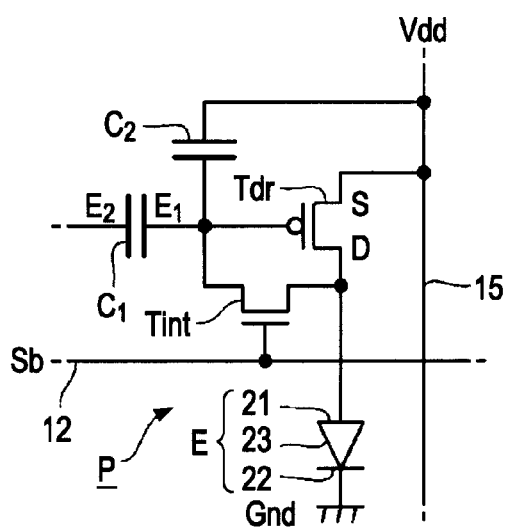
FIG. 20 is a circuit diagram illustrating the configuration of a unit element of another modified example.

A capacitor element C2 may be inserted, as shown in FIG. 20, between the gate electrode and the source electrode (power supply line 15) of the drive transistor Tdr. With this configuration, the gate potential Vg of the drive transistor Tdr set in the writing period can be held in the capacitor element C2 during the driving period. However, if the area of the gate electrode (area of the channel region) of the drive transistor Tdr is sufficiently large, the gate potential Vg can be held in the gate capacitor of the drive transistor Tdr. In this case, the gate potential Vg can be held during the driving period even if the capacitor element C2 is not disposed as in the first and second embodiments.

Figure 21:
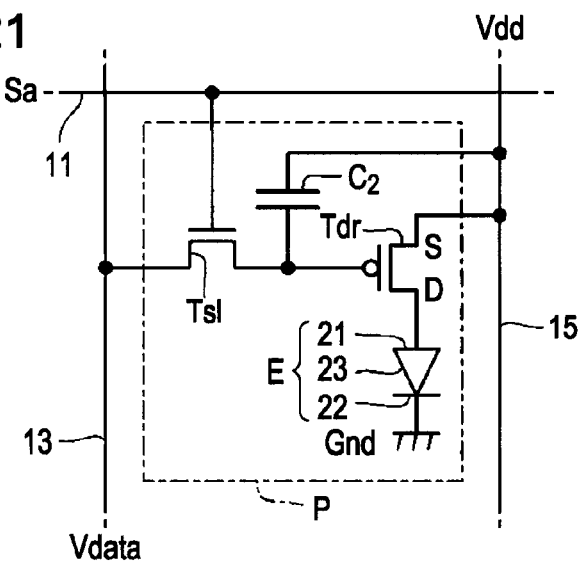
FIG. 21 is a circuit diagram illustrating the configuration of a unit element of another modified example.

The unit element P shown in FIG. 21 may be also be used. In this unit element P, the electrical connection between the gate electrode of the drive transistor Tdr and the data line 13 is controlled by the selection transistor Ts1 without forming the capacitor element C1 and the initializing transistor Tint (initializing line 12). The capacitor C2 is interposed between the gate electrode and the source electrode (power supply line 15) of the drive transistor Tdr.

With this configuration, when the selection transistor Ts1 is turned ON, the data potential Vdata corresponding to the grayscale level specified by the light-emitting element E is supplied to the gate electrode of the drive transistor Tdr from the data line 13 via the selection transistor Ts1. In this case, since electric charge corresponding to the data potential Vdata is stored in the capacitor element C2, the gate potential Vg of the drive transistor Tdr can be maintained at the data potential Vdata even if the selection transistor Ts is turned OFF. Accordingly, the current corresponding to the gate potential Vg of the drive transistor Tdr (i.e., the current corresponding to the data potential Vdata) can be continuously supplied to the light-emitting element E. Then, the light-emitting element E emits light with the luminance corresponding to the data potential Vdata.

The capacitor element C2 shown in FIG. 21 is disposed on the surface of the substrate 10 in a manner similar to the capacitor element C1. In this modified example, advantages similar to those of the first or second embodiment can be achieved. As described above, the capacitor element connected to the gate electrode of the drive transistor Tdr may be the capacitor element C1 for setting the gate potential Vg of the drive transistor Tdr by capacitive coupling or the capacitor element C2 for holding the data potential Vdata supplied to the gate electrode of the drive transistor Tdr from the data line 13.

Second Modified Example

In the above-described embodiments and modified examples, the first electrode 21 is composed of a light-reflective material. Alternatively, light emitted from the light-emitting layer 23 toward the substrate 10 may be reflected by a reflective layer different from the first electrode 21 and may be output to the side opposite the substrate 10. In this configuration, a reflective layer is formed on the surface of the first insulating layer L1 by a light-reflective material, and the first electrode 21 is formed such that it covers the reflective layer. In this case, the first electrode 21 is composed of a light-transmissive, conductive material, such as ITO or IZO. In the above-described embodiments, the second electrode 22 is composed of a light-transmissive material. Alternatively, it may be formed of a light-shielding or light-reflective, conductive material and formed to be sufficiently thin. In this case, light emitted from the light-emitting layer 23 can pass through the second electrode 22.

The invention is also applicable to a bottom-emission-type light-emitting device in which light emitted from the light-emitting layer 23 passes through the substrate 10 and is output. In this configuration, the second electrode 22 is composed of a light-reflective, conductive material, and also, the first electrode 21 is composed of a light-transmissive, conductive material. Then, light emitted from the light-emitting layer 23 toward the substrate 10 and light emitted from the light-emitting layer 23 toward the side opposite the substrate 10 and reflected on the surface of the second electrode 22 pass through the first electrode 21 and the substrate 10 and are output.

Third Modified Example

In the first and second embodiments the power supply line 15 is not overlapped with the selection transistor Ts1 or the initializing transistor Tint. However, it may be overlapped with the selection transistor Ts1 or the initializing transistor Tint.

Fourth Modified Example

In the second embodiment, the connecting portion 62 is formed in the gap between the first gate electrode 111 and the second gate electrode 112 of the selection transistor Ts1. Similarly, the second portion 152 of the power supply line 15 may be formed in the gap between the first gate electrode 121 and the second gate electrode 122 of the initializing transistor Tint.

Fifth Modified Example

In the first embodiment, the power supply line 15 includes only a portion extending in the x direction (corresponding to the first portion 151). However, as in the second embodiment, the power supply line 15 may also include a portion extending in the Y direction to interconnect the first portions 151 (corresponding to the second portion 152). The second portion 152 is extended in the Y direction in the gap between the connecting portion 61 and the electrical continuity portion 71 shown in FIG. 7 or the gap between the adjacent unit elements P, and interconnects the power supply lines 15 (first portions 151) located adjacent to each other in the Y direction. With this configuration, the resistance of the power supply line 15 can further be reduced compared with the first embodiment.

Sixth Modified Example

In the above-described embodiments, the light-emitting layer 23 is formed only in the inner periphery of the barrier 25. Alternatively, the light-emitting layer 23 may be formed continuously on the entire surface of the substrate 10 (and more specifically, on the entire surface of the second insulating layer L2). With this configuration, a less expensive film-forming technique, such as spin coating, may be employed for forming the light-emitting layer 23. The first electrode 21 is formed for each light-emitting element E. Accordingly, even though the light-emitting layer 23 is continuously formed over the plurality of light-emitting elements E, the light quantity of the light-emitting layer 23 can be controlled for each light-emitting element E. In the configuration in which the light-emitting layer 23 is continuously formed over the plurality of light-emitting elements E, the provision of the barriers 25 can be omitted.

If ink-jet method (droplet discharge method) in which droplets of a light-emitting material are discharged to each space partitioned by the barriers 25 is employed for forming the light-emitting layer 23, it is preferable that the barriers 25 be formed on the surface of the second insulating layer L2, as in the first and second embodiments. The method for forming the light-emitting layer 23 for each light-emitting element E can be changed according to the necessity. More specifically, a light-emitting-material film member formed on the entire surface of the substrate 10 may be selectively removed, or various patterning techniques, such as a laser transfer (laser-induced thermal imaging (LTIT) method, may be employed. In this case, the light-emitting layer 23 can be formed for each light-emitting element E without the need to form the barriers 25. As described above, the barriers 25 are not essential for the light-emitting device.

Seventh Modified Example

In the foregoing embodiments, the light-emitting element E includes the light-emitting layer 23 composed of an organic EL material. However, the light-emitting element E is not restricted to this type. For example, a light-emitting element including a light-emitting layer composed of an inorganic EL material or a light-emitting diode (LED) may be employed. That is, the specific structure or material of the light-emitting element is not restricted as long as the light-emitting element emits light by the supply of electric energy (typically, the supply of a current).

Applied Examples

Figure 22:
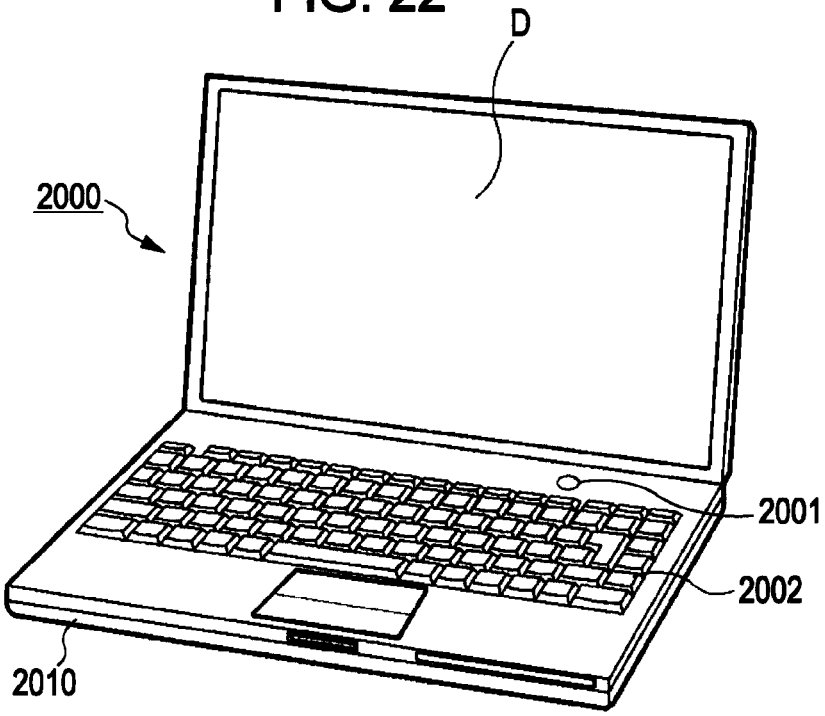
FIG. 22 is a perspective view illustrating a personal computer, which is a specific example of an electronic apparatus according to an embodiment of the invention.

Specific examples of electronic apparatuses utilizing the light-emitting device of an embodiment of the invention are described below. FIG. 22 is a perspective view illustrating the configuration of a mobile personal computer 2000 using one of the above-described light-emitting devices D. The personal computer 2000 includes one of the light-emitting devices D as a display unit and a main unit 2010. The main unit 2010 includes a power switch 2001 and a keyboard 2002. In this light-emitting device D, since the light-emitting layer 23 composed of an organic EL material is used, a screen having a wide viewing angle can be provided.

Figure 23:
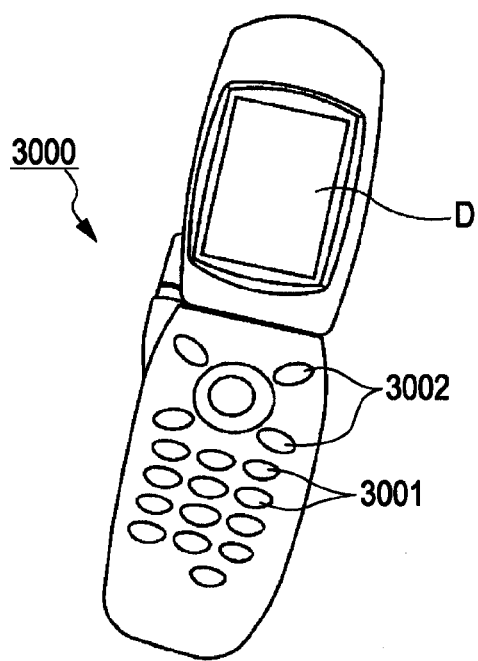
FIG. 23 is a perspective view illustrating a cellular telephone, which is another specific example of an electronic apparatus according to an embodiment of the invention.

FIG. 23 illustrates the configuration of a cellular telephone 3000 utilizing one of the light-emitting devices D. The cellular telephone 3000 includes a plurality of operation buttons 3001, scroll buttons 3002, and the light-emitting device D. The scroll buttons 3002 are operated so that the screen displayed on the light-emitting device D can be scrolled.

Figure 24:
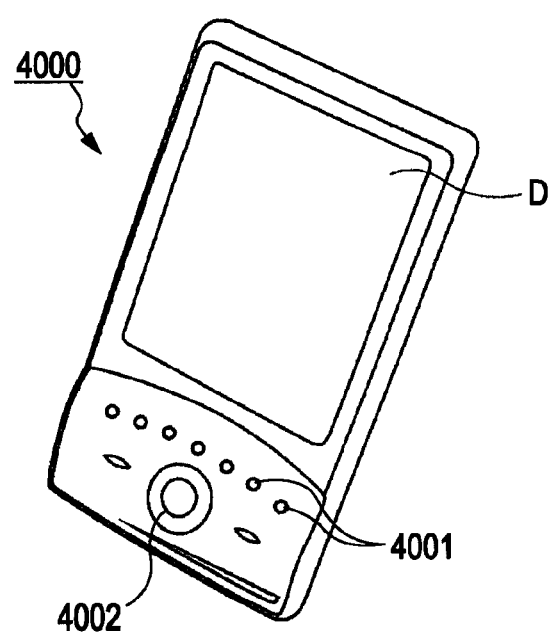
FIG. 24 is a perspective view illustrating a portable information terminal, which is another specific example of an electronic apparatus according to an embodiment of the invention.

FIG. 24 illustrates the configuration of a portable information terminal 4000 (personal digital assistants PDA) utilizing one of the light-emitting devices D. The portable information terminal 4000 includes a plurality of operation buttons 4001, a power switch 4002, and the light-emitting device D as a display unit. When the power switch 4002 is operated, various items of information, such as an address book and a diary, can be displayed on the light-emitting device D.

The electronic apparatuses utilizing a light-emitting device of an embodiment of the invention may include, not only the apparatuses shown in FIGS. 22 through 24, but also digital still cameras, televisions, video cameras, car navigation systems, pagers, electronic diaries, electronic paper, calculators, word-processors, workstations, videophones, point-of-sale (POS) terminals, printers, scanners, copying machines, video players, and touch panels. The purpose of the light-emitting device of an embodiment of the invention is not restricted to the display of images. For example, in an image forming apparatus, such as a photo-writing printer or an electronic copying machine, a write head that exposes light to a photosensitive member in accordance with an image to be formed on a recording material, such as paper, is used. The light-emitting device of an embodiment of the invention can be used as this type of write head.

What is claimed is:

1. A light-emitting device, comprising:
a plurality of pixels, aligned along a first direction, above a substrate;
each of the plurality of pixels including:
a light-emitting element having a first electrode and a second electrode,
a first transistor connected between a power supply line and the first electrode of the light-emitting element,
an electrical continuity portion electrically connected to a drain of the first transistor and the first electrode of the light-emitting element,
a second transistor connected between a gate electrode of the first transistor and the drain of the first transistor, and
a connecting portion electrically connected to the gate electrode of the first transistor and one of a source and a drain of the second transistor, wherein
the power supply line extends over the plurality of pixels in a first direction; and
the electrical continuity portion, the connecting portion and the first transistor are disposed on the same side of the power supply line.

2. The light-emitting device as set forth in claim 1, wherein the electrical continuity portion, the connecting portion, and the power supply line are formed in a first layer.

3. The light-emitting device as set forth in claim 1, wherein the power supply line includes a first supply line and a second power supply line; and
the electrical continuity portion and the connecting portion are arranged in an area between the first supply line and the second power supply line.

4. The light-emitting device as set forth in claim 1, further comprising:
a capacitor element electrically connected to the gate electrode of the first transistor;
the gate electrode of the first transistor being arranged between the capacitor element and the electrical continuity portion in a plan view;
the power supply line including a first portion extending in the first direction; and
the first portion of the power supply line overlapping the capacitor element.

5. The light-emitting device as set forth in claim 4, further comprising:
a selection transistor connected between a selection line and the capacitor element;
the gate electrode of the first transistor being set at a potential corresponding to a data signal that is supplied from a data line through the selection transistor, which has been turned on; and
the capacitor element being arranged between the selection transistor and the first transistor in a plan view.

6. The light-emitting device as set forth in claim 5, wherein in the first direction, the selection transistor is arranged on one side along the first direction; and
the second transistor is arranged on the other side along the first direction.

7. A light-emitting device comprising:
a first transistor connected between a power supply line and a first electrode of a light-emitting element;
an electrical continuity portion electrically connected to a drain of the first transistor and the first electrode of the light-emitting element;
a second transistor connected between a gate electrode of the first transistor and the drain of the first transistor; and
a connecting portion electrically connected to the gate electrode of the first transistor and one of a source and a drain of the second transistor, wherein
the first transistor is positioned between the electrical continuity portion and the connecting portion in a plan view.

8. A light-emitting device, comprising:
a first transistor connected between a power supply line and a first electrode of a light-emitting element;
an electrical continuity portion electrically connected to a drain of the first transistor and the first electrode of the light-emitting element;
a second transistor connected between a gate electrode of the first transistor and the drain of the first transistor; and
a connecting portion electrically connected to the gate electrode of the first transistor and one of a source and a drain of the second transistor, wherein:

the power supply line extends in a first direction;

the electrical continuity portion is positioned, in the first direction, on one side with respect to the first transistor; and the connecting portion is positioned on the other side with respect to the first transistor.

9. The light-emitting device as set forth in claim 7, wherein the power supply line includes a first portion extending in a first direction; and the electrical continuity portion, the connecting portion, and the power supply line are formed in a first layer.

10. The light-emitting device as set forth in claim 7, further comprising:

a capacitor element electrically connected to the gate electrode of the first transistor, the capacitor element being arranged between the first transistor and the connecting portion in a plan view, wherein:

the power supply line includes a first portion extending in a first direction; and the first portion of the power supply line overlaps the capacitor element.

11. The light-emitting device as set forth in claim 10, further comprising:

a selection transistor connected between a selection line and the capacitor element, wherein:

the gate electrode of the first transistor being set at a potential corresponding to a data signal that is supplied from a data line through the selection transistor, which has been turned on; and the capacitor element being arranged between the selection transistor and the first transistor in a plan view.

12. The light-emitting device as set forth in claim 1, wherein the power supply line comprising a first portion extending in the first direction and a second portion extending in a second direction crossing the first direction.

13. A light-emitting device, comprising:

a substrate; and a pixel disposed above the substrate, the pixel being aligned with other pixels along a first direction and connected to a power supply line, the power supply line extending over the pixel in the first direction, the pixel comprising:

a light-emitting element having a first electrode and a second electrode;

a first transistor having a gate electrode and a drain, and being connected between the power supply line and the first electrode of the light-emitting element;

an electrical continuity portion electrically connected to the drain of the first transistor and the first electrode of the light-emitting element;

a second transistor having a source and a drain, and being connected between the gate electrode of the first transistor and the drain of the first transistor; and a connecting portion electrically connected to the gate electrode of the first transistor and one of the source and the drain of the second transistor, the electrical continuity portion, the connecting portion and the first transistor being disposed on the same side of the power supply line.

14. The light-emitting device as set forth in claim 13, wherein the first transistor being turned on and supplying a current to the light-emitting element in a driving period, the second transistor being turned on in an initializing period.

* * * * *